United States Patent
Arai

(10) Patent No.: US 6,656,800 B2
(45) Date of Patent: Dec. 2, 2003

(54) METHOD OF MANUFACTURING SEMICONDUCTOR DEVICE INCLUDING PROCESS FOR IMPLANTING IMPURITIES INTO SUBSTRATE VIA MOS TRANSISTOR GATE ELECTRODE AND GATE INSULATION FILM

(75) Inventor: Norihisa Arai, Omiya (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/886,980

(22) Filed: Jun. 25, 2001

(65) Prior Publication Data

US 2002/0031877 A1 Mar. 14, 2002

(30) Foreign Application Priority Data

Jun. 26, 2000 (JP) ......................................... 2000-191589

(51) Int. Cl.⁷ .......................................... H01L 21/8234
(52) U.S. Cl. ....................... 438/275; 438/218; 438/529
(58) Field of Search ................................ 438/154, 197, 438/199, 218, 225, 229, 232, 275, 299, 527, 529, 532

(56) References Cited

U.S. PATENT DOCUMENTS

| | | | | |
|---|---|---|---|---|
| 5,670,404 A | * | 9/1997 | Dai ............................. | 437/52 |
| 6,005,270 A | * | 12/1999 | Noguchi ..................... | 257/315 |
| 6,049,113 A | * | 4/2000 | Shida ......................... | 257/369 |
| 6,281,050 B1 | * | 8/2001 | Sakagami .................... | 438/142 |
| 6,297,082 B1 | * | 10/2001 | Lin et al. ..................... | 438/217 |
| 6,300,655 B1 | * | 10/2001 | Ema et al. .................... | 257/306 |

FOREIGN PATENT DOCUMENTS

| | | | |
|---|---|---|---|
| JP | 02-246227 | 10/1990 | |
| JP | 06268178 | * 9/1994 | ......... H01L/27/112 |
| KR | 2000-0035711 | 6/2000 | |

OTHER PUBLICATIONS

T. Ukeda, et al., "High Reliability Trench Isolation Technology with Elevated Field Oxide Structure for Sub–Quarter Micron CMOS Devices" Solid State Devices and Materials, Yokohama 1996, pp. 260–262.

F. Arai, et al., "High Density (4.4 F²) NAND Flash Technology Using Super–Shallow Channel Profile (SSCP) Engineering", IEEE, 2000, pp. 775–778.

* cited by examiner

Primary Examiner—Amir Zarabian
Assistant Examiner—Pamela Perkins
(74) Attorney, Agent, or Firm—Oblon, Spivak, McClelland, Maier & Neustadt, P.C.

(57) ABSTRACT

A gate oxide film and a first layer of a multi-layered gate electrode are stacked on a substrate and by a gate prefabrication technique, an oxide layer of an element isolation region is formed in a self-alignment manner using the first layer of the gate electrode as a mask, impurities for a transistor channel control are doped by ion implantation via the first layer of the gate electrode and the gate oxide film, and the doped impurities are activated by a heating step, whereby an impurity profile at the transistor channel portion is precisely formed.

17 Claims, 12 Drawing Sheets

A-A' SECTION

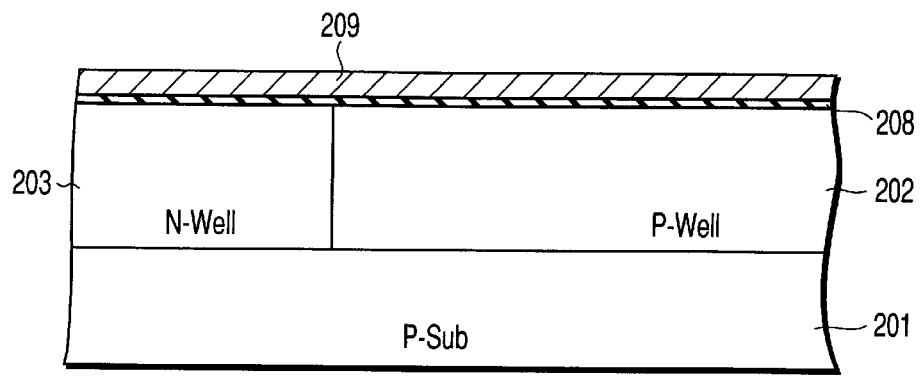
F I G. 1A
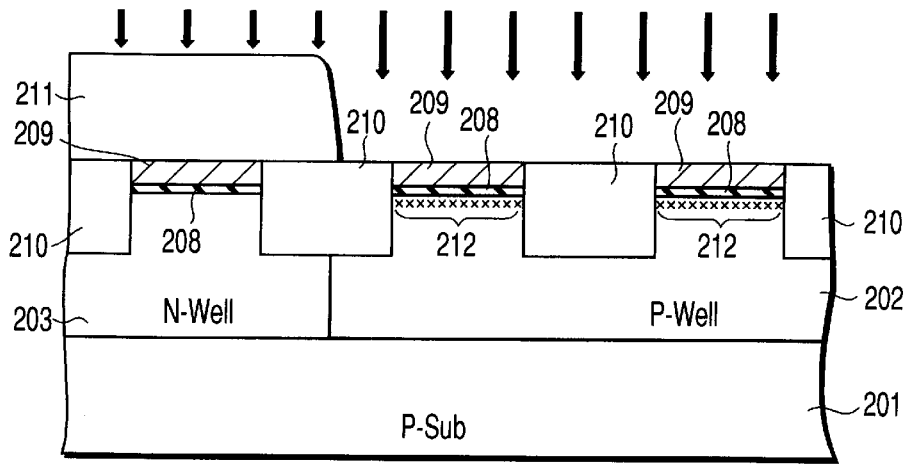
F I G. 1B
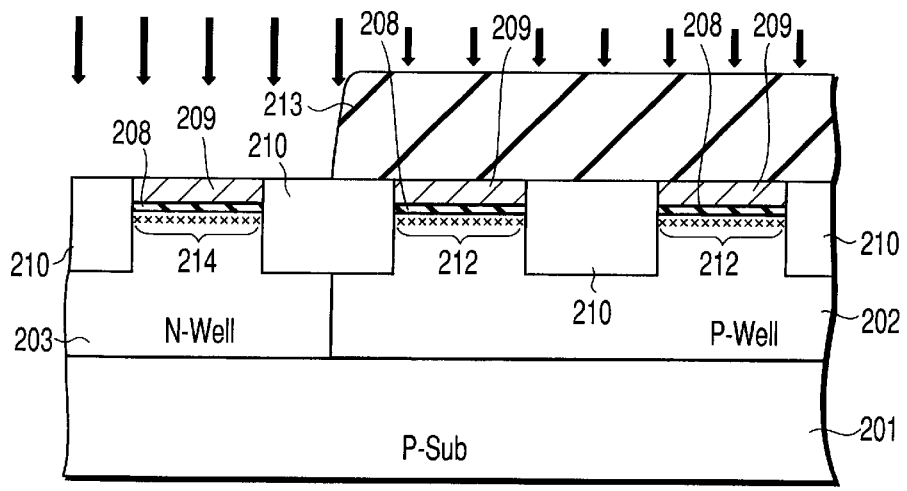
F I G. 1C

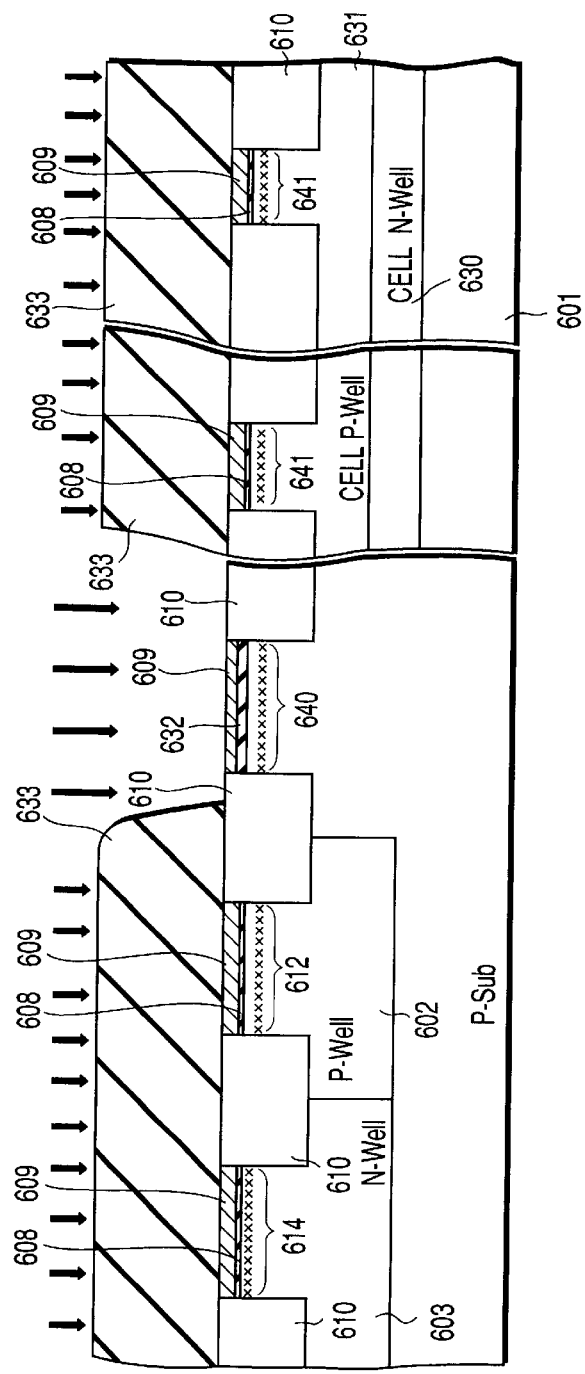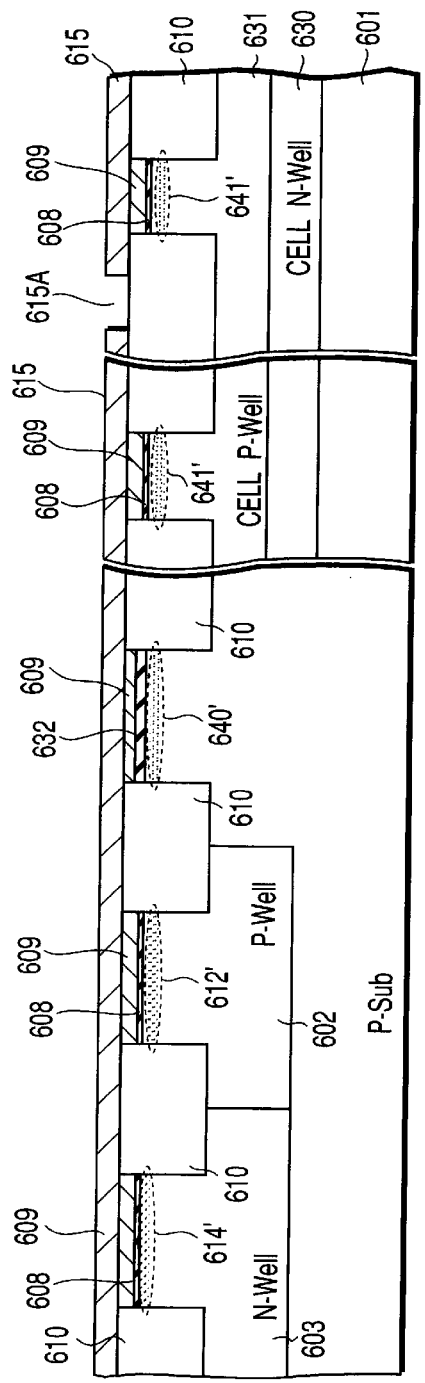
F I G. 9A
F I G. 9B

METHOD OF MANUFACTURING SEMICONDUCTOR DEVICE INCLUDING PROCESS FOR IMPLANTING IMPURITIES INTO SUBSTRATE VIA MOS TRANSISTOR GATE ELECTRODE AND GATE INSULATION FILM

CROSS-REFERENCE TO RELATED APPLICATIONS

This application is based upon and claims the benefit of priority from the prior Japanese Patent Application No. 2000-191589, filed Jun. 26, 2000, the entire contents of which are incorporated herein by reference.

BACKGROUND OF THE INVENTION

1. Field of the Invention

The present invention relates to a semiconductor device manufacturing method for facilitating precise and stable forming and holding of a impurity profile that exists at a channel portion under a transistor gate electrode, which is essential to reduce a transistor gate length to the minimum in a technique (hereinafter, referred to as a gate prefabrication technique) for forming an element isolation region in a self alignment manner by using a transistor forming region that has been formed in advance in order to make it possible to form transistors with high concentration. This manufacturing method is applied to manufacture of peripheral transistors of an NAND-type flash memory manufactured by employing a gate prefabrication technique, for example.

2. Description of the Related Art

There has been made an attempt to form a MOS type semiconductor device, in which a part of a multilayered gate electrode, for example, a first layer is first formed in a predetermined region for forming an impurity diffusion layer and a channel portion. Then, an element isolation region is formed in a self alignment manner by employing the first layer as a mask, thereby achieving high concentration and low cost (refer to T. Ukeda et al., SSDM 1996, pp. 260–262). A description will be given with reference to FIG. 12A to FIG. 12D by way of showing this conventional attempt. First, a N-Well 103 and P-Well 102 are formed on a P-type silicon substrate 101, and a SiO$_2$ film 104 is formed on the P type silicon substrate 101. Further, using a resist pattern (not shown) as a mask converting the P-Well 102, a boron "B" ion 105 is implanted onto the N-Well 103 in order to perform P type transistor channel control. Furthermore, with the resist pattern 106 being employed as a mask, a "B" ion 107 is implanted on the P-Well 102 in order to perform N type transistor channel control.

Next, after removing the SiO$_2$ film 104, a gate oxide film 108 is formed by thermal oxidization, and a polysilicon film 109 is formed (FIG. 12B). At this time, the boron "B" ions implanted for the purpose of transistor channel control shown in FIG. 12A are activated, and diffuses into the P type silicon substrate 101 as impurity diffusion regions 105' and 107', respectively, as shown in FIG. 12B.

Next, the polysilicon film 109 that exists in a desired element isolation region is etched off; and the SiO$_2$ film 108 and P type silicon substrate 101 are etched off to form a trench 110T. The SiO$_2$ film 110 is buried in the thus formed trench 110T by a CVD technique, as shown in FIG. 12C, and then, heat treatment is applied to the buried film. The heat treated film is flattened using a CMP method, and the silicon oxide film remaining on the polysilicon film 109 is etched away.

Next, a polysilicon film 111 is formed on the SiO$_2$ film 110 buried in the trench 110T and on the polysilicon film 109, and then, a resist pattern 112 is formed on a predetermined region of the polysilicon film 111 for forming a gate electrode wiring layer. At this time, it is well known that a high temperature densifying step is required because there is a need to increase concentration of the SiO$_2$ film 110 in order to function the film 110 buried in the trench 110T as an insulation film for element isolation. The SiO$_2$ film 110 is not a thermal oxide film, but a sintered CDV film.

With this heating step, the boron "B" impurities introduced into the silicon substrate 101 for the purpose of transistor channel control further diffuses deeply into the silicon substrate 101, and impurity diffusion regions 105" and 107" are formed, respectively, as shown in FIG. 12C.

Next, using the resist pattern 112 as a mask, the patterns of the polysilicon film 111 and polysilicon film 109 are formed by an etching process. Then, after releasing the resist pattern 112, a step of forming an LDD region 113, a step of forming a side wall 114 of a gate electrode, and a step of forming a diffusion layer 116 are carried out. Further, an N type transistor and a P type transistor are formed through a post-oxidization step at 800° C. and for about 600 minutes. Of course, at this heating step as well, the impurity of boron "B" slightly introduced into the silicon substrate 101 diffuses over the wide area of the silicon substrate 101.

A semiconductor device manufactured in accordance with the above described steps is formed in a self alignment manner together with the channel portion and diffusion layer area that configure transistors. Thus, an element isolation region can be formed to have a minimum size. Therefore, this technique can be essential in forming a transistor with high concentration.

In contrast, there occurs a disadvantage that a channel length of a transistor cannot be reduced to the minimum for the reasons described below. Of course, it is required to reduce the channel length to the minimum in order to miniaturize a transistor and provide a high element concentration. In order to reduce the channel length to the minimum, it is essential to control the transistor channel profile. For example, in general, in an buried channel P type transistor which is widely used, as is well known, it is effective to set this buried channel closer to the silicon substrate surface. However, it is necessary to provide a sharp impurity profile in order to achieve this channel positioning. In addition, in an NMOS as well, it is well known that a better controlled profile is effective.

Hence, in the conventional example shown in FIG. 12A to FIG. 12D, an element isolation region is manufactured in a self alignment manner with respect to a transistor forming region, and thus, the element isolation region can be finely manufactured. However, from the reasons described previously, with respect to a transistor channel length, it is very difficult to realize it due to the difficulty of the channel impurity profile control. Thus, there is a disadvantage that the transistor channel length cannot be reduced to the minimum, and the transistor forming region occupies a large area on a chip. Hereinafter, the reasons will be described in detail.

Conventional semiconductor device manufacturing steps widely employed include the steps of: providing an element isolation insulation film on the surface of a substrate; introducing impurities for the purpose of transistor channel control; forming a gate insulation film; and forming a gate electrode of a transistor.

In contrast, the prior art process steps shown in FIG. 12A to FIG. 12D include the steps of: introducing impurities for the purpose of transistor channel control; forming a gate insulation film; forming a part of a gate electrode; and forming an element isolation insulation film. Thus, the heating step after introducing impurities for the purpose of transistor channel control additionally is included in the step of forming an element isolation insulation film. This heating step is carried out at 850° C. and for about 30 minutes, for example. With this heating step, impurities added for the purpose of transistor channel control diffuse unnecessarily and significantly into the substrate, which makes it difficult to perform precise channel profile control. This leads to impairment of reducing the transistor channel length to the minimum.

In addition, if the transistor channel profile cannot be controlled as a desired steep profile, it is known that the following failure will occur in addition to the impairment of reducing the transistor channel length to the minimum. For example, in the case where "B (boron)" added for the channel control is further diffused as P type impurities in an N type transistor forming region, the spread in the depth direction of the substrate causes a rise in threshold value Vth due to an increase in substrate bias effect. It is a well known fact that this rise causes an impairment when a transistor circuit is operated at a high speed. In order to minimize this disadvantage, it is known that the concentration of impurities near the surface of a silicon substrate is increased. In the conventional example shown in FIG. 12A to FIG. 12D, the heating time and temperature after introducing impurities are excessive, and thus, the degree of the impurity diffusion is also excessive. Therefore, an increase in back bias effect cannot be avoided, which causes a defect in high speed circuit operation.

As a technique for avoiding such defect caused by the heating step, there is considered a technique for introducing impurities for transistor channel control after forming a gate electrode, by means of ion implantation, for example. However, even if such technique is employed, a limitation is applied to introduction of this technique for the following reasons, and desired steep profile control is not possible.

In general, boron whose ion mass is comparatively light is used as impurities for transistor channel control. When ion mass is light, and acceleration energy is large, it is well known that an impurity profile during ion implantation spreads (Reference: Seijiro Furukawa, Semiconductor Device, Corona Co., Ltd. pp. 57–58: S. M Sea, Supervized Translated by: Takeishi, Nishi, Kayama, Ultra-LSI Technology, Soken Shuppan, pp. 231–236).

In a technique for introducing impurities for transistor channel control after forming a gate electrode, if the film thickness of the gate electrode is large, a boron ion is implanted under acceleration energy conditions required for penetrating the thick gate electrode material and gate oxide film. Therefore, although the diffusion of boron impurities at the heating step can be avoided, a wide spread profile is formed by scattering during ion implantation. This makes it difficult to perform desired profile control.

Although it is considered to reduce the film thickness of the gate electrode, reducing the thickness of the gate electrode or the gate wiring layer causes an increase in wiring resistance, resulting in a degradation of high speed element operation. Thus, a polysilicon film of about 400 nm or more in thickness is required to achieve a required sheet resistance $Rs=100$ $\Omega/\square$ or less. In this case, high acceleration energy for the ion implantation is required to inject ions into a silicon substrate through a polycrystalline silicon of about 400 nm in thickness. However, as described above, production of such a desired profile is difficult because of ion scattering during such a high energy implantation.

In addition, in recent years, a demand for an electrically erasable programmable nonvolatile memory device is increasing in market. However, an increase in transistor substrate back bias effect causes a defect in high speed circuit operation in such a nonvolatile memory device, and causes in increase of a size of a boost power supply circuit. This is one of the problems to be solved.

The reason is briefly described as follows. In a circuit configuring an electrically erasable programmable nonvolatile memory device, when data write/erase operation is electrically performed for a memory cell transistor, it is general to employ a circuit configuration in which a plurality of power supplies are internally provided based on an external power supply voltage.

For example, an NAND type flash memory device is used as an electrically erasable programmable nonvolatile memory device. In this case, an internal power supply is provided for producing 20 volts from an external power supply voltage of 5 volts. A charge pump is conventionally used as an available voltage boosting circuit system (see an article supervised by Takuo Sugano and edited by Tetsuya Iizuka: Design of CMOS ultra-LSI, Baifu-kan, pp. 192–193). In this case, however, if a substrate back bias effect of a transistor forming a boost circuit for carrying out the charge pumping is large, the boost efficiency will be degraded. Thus, the boost circuit is increased in size, and therefore, the chip size is increased. Therefore, in order to ensure boost efficiency, it is essential to use a transistor with its minimized back bias effect. In particular, the NAND type flash memory device using an external source voltage of 5 volts, for example, requires a write/erasure voltage of 20 volts, and the problem is more serious.

BRIEF SUMMARY OF THE INVENTION

According to one aspect of the present invention, there is provided a semiconductor device manufacturing method comprising:

forming a gate oxide film of a MOS type transistor on a semiconductor substrate;

forming a conductive film that configures a part of a gate electrode on the gate oxide film; and implanting impurities in the semiconductor substrate through the conductive film and gate oxide film.

According to another aspect of the present invention, there is provided a semiconductor device manufacturing method comprising:

forming a gate oxide film of a MOS type transistor on a semiconductor substrate;

forming a conductive film that configures a part of a gate electrode on the gate oxide film;

removing the gate oxide film and conductive film formed on a predetermined region for forming an element isolation region;

forming a trench in the semiconductor substrate;

burying an element isolation oxide layer in the trench; and implanting impurities into the semiconductor substrate through the conductive film and gate oxide film.

With this configuration, desired profile control can be achieved as compared with a conventional semiconductor device in which a desired transistor channel control has been difficult. In the manufacture of an N type transistor, a back bias effect is significantly restricted, and such effect causes a Vth rise of about $\frac{2}{3}$ as compared with a conventional device. In addition, a short channel effect/punch through leak is restricted, the gate length is reduced to the minimum.

In addition, in the manufacture of a P type transistor, the gate length can be reduced by about 0.1 μm. Therefore, a semiconductor device with high speed, high performance, and high concentration can be achieved. In particular, a two-layer gate electrode type transistor is employed as a memory cell, and an electrode terminal using a contact plug is formed at a first gate electrode of a two-layer gate electrode via a gate insulation film provided on a semiconductor substrate, which is preferably applicable to a semiconductor device of such a type functioning as a general transistor. In addition, in the case where the two-layer gate electrode type transistor and memory cell are formed on the same substrate, there exists an N type transistor to which a high potential is applied during write/erase operation. The present invention is applied to an N type transistor to which the high potential is applied. As a result, a back bias effect is significantly restricted, and transfer efficiency in a charge pump circuit is improved, making it possible to reduce the chip size.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIGS. 1A–1E are views showing the steps of manufacturing a semiconductor device by applying a manufacturing method according to the present invention;

FIG. 9A to FIG. 9D are views showing the steps of manufacturing a semiconductor device by applying the manufacturing method according to the present invention;

DETAILED DESCRIPTION OF THE INVENTION

Figure 10A:
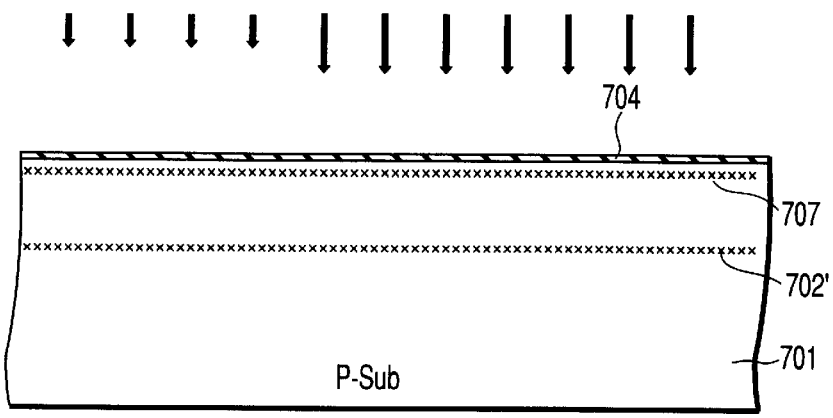
FIG. 10A to FIG. 10C are views showing the steps of manufacturing a semiconductor device by applying the manufacturing method according to the present invention.
Figure 10B:
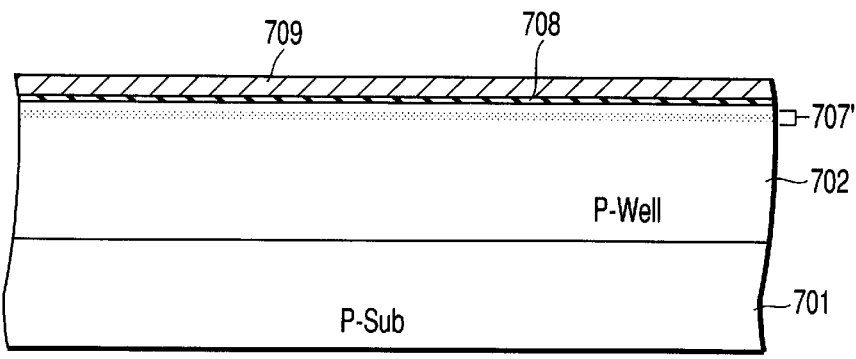
Figure 10C:
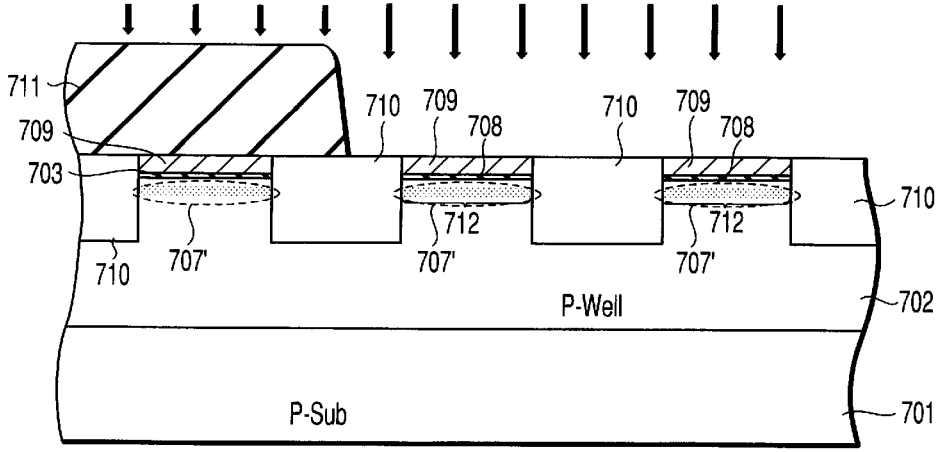
Figure 11A:
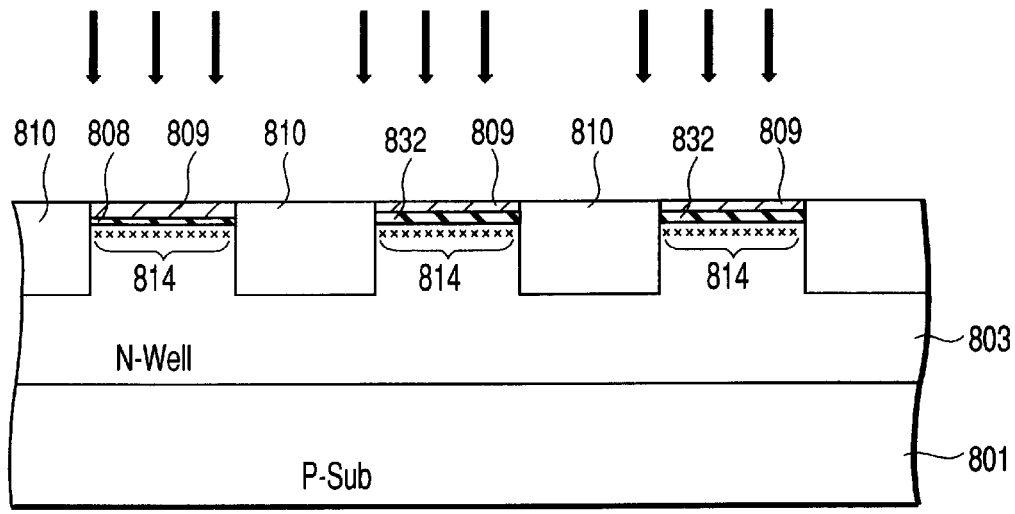
FIG. 11A and FIG. 11B are views showing the steps of manufacturing a semiconductor device by applying the manufacturing method according to the present invention.
Figure 11B:
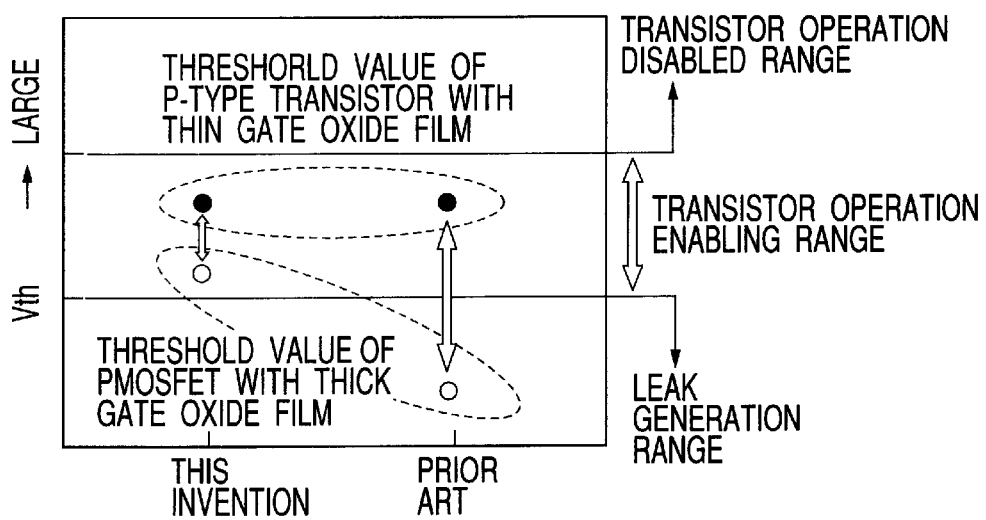
Figure 12A:
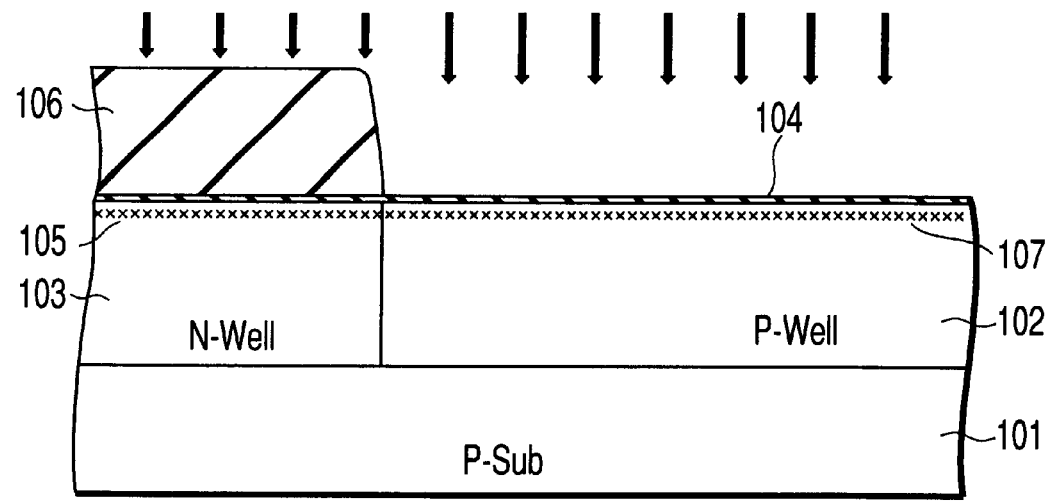
FIG. 12A to FIG. 12D are views showing the steps of manufacturing a semiconductor device by applying the conventional manufacturing method.
Figure 12B:
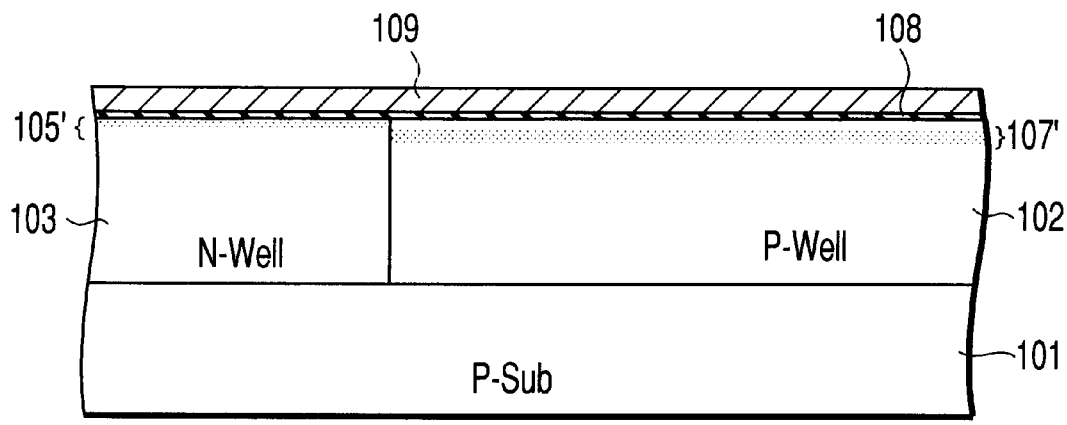
Figure 12C:
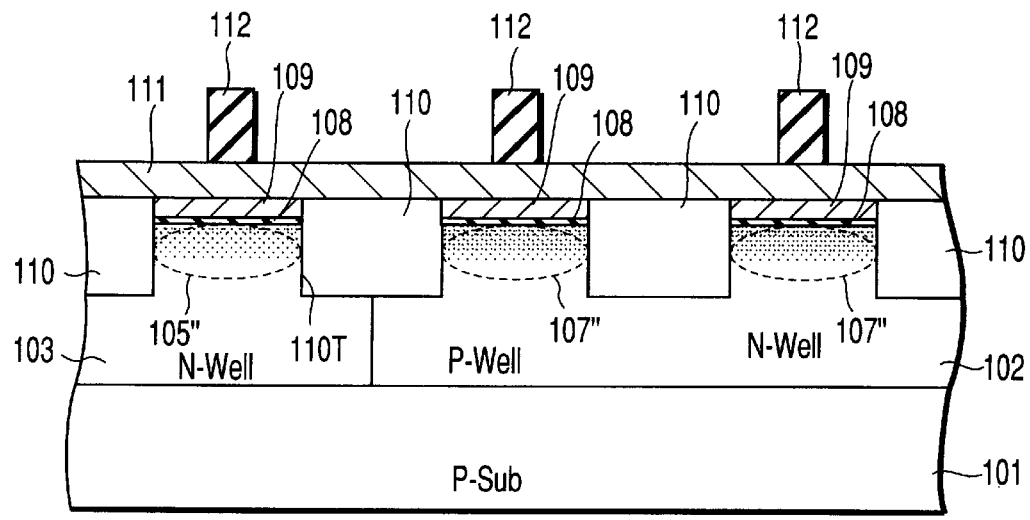
Figure 12D:
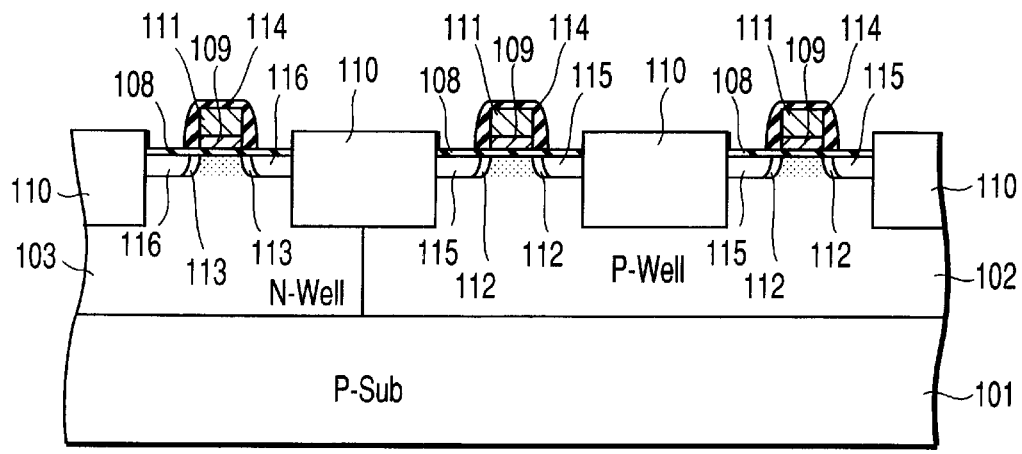

Hereinafter, an example of a semiconductor device manufacturing method according to the present invention will be described with reference to FIG. 1A to FIG. 1E by way of exemplifying a case of manufacturing a transistor formed according to a gate prefabrication technique which achieves high element concentration. An advantageous effect of the manufacturing method will be described with reference to FIG. 2 and FIG. 3. A second example of the manufacturing method will be described with reference to FIG. 5A and FIG. 5B. A third example of the manufacturing method will be described with reference to FIG. 6A and FIG. 6B and FIG. 7A and FIG. 7B. A fourth example of the manufacturing method will be described with reference to FIG. 8. A fifth example of the manufacturing method will be described with reference to FIG. 9A to FIG. 9D, wherein an example of applying the present invention to transistor forming using a gate prefabrication technique in which an element can be packaged with high concentration is shown as an example of applying the present invention to peripheral elements, each of which configures a NAND type flash memory in which the maximum effect of the present invention has been verified. In addition, FIG. 10A to FIG. 10C show an application example in which transistors comprising a plurality of threshold values are provided on the same substrate by using the technique of the present invention without an increased number of steps. FIG. 11A and FIG. 11B describe an example for utilizing an advantageous effect of the present invention, wherein the same conductivity type transistors with different oxide film thickness is provided on the same substrate are controlled in the same channel control process.

(1) First Embodiment

First, in FIG. 1A, N-Well 203 and P-Well 202 are formed on a P type silicon substrate 201 by using a well known ion implantation technique and a diffusion technique; a gate oxide film 208 of 10 nm in thickness is formed in dry atmosphere of 800° C.; a polycrystalline silicon film 209 of 50 nm in thickness is deposited by using a well known LP-CDV technique; and at the same time, a phosphor "P" is doped.

Next, in the state shown in FIG. 1A, a TEOS film is laminated to be 100 nm in thickness on the polycrystalline silicon film 209. Then, a resist pattern having an opening for forming an element isolation region 210 shown in FIG. 1B is formed, and the corresponding portion of TEOS film and the polycrystalline silicon film 209 is etched away. Next, with the patterned TEOS film being masked, the gate oxide film 208 and P type silicon substrate 201 that are present in the opening for forming an element isolation region is etched to form a trench 210T of 0.4 μm in depth, and, as an element isolation insulation film, a silicon oxide film 210 is deposited to be 1.5 μm in thickness by a well known plasma CVD technique.

Next, the silicon oxide film 210 is heat treated at 1050° C. and for 60 seconds to dencify the film 210, and the resultant film is flattened by using a well known CMP technique. In this manner, the silicon oxide film 210 is selectively buried in a trench 210T provided in the P type silicon substrate 201. At this time, a TEOS film on the polycrystalline silicon 209 that exists in a region other than the element isolation region is removed in accordance with the steps of flattening the silicon oxide film 210 by the CMP.

Next, by using a resist pattern mask 211 having an opening for forming at least an N type transistor, a "B" ion is implanted at an acceleration energy of 100 KeV and a dosage of 5E12/cm$^2$ by using a well known ion implantation technique. At this time, the "B" ion passes through the polycrystalline silicon 209 and the gate oxide film 208, and is implanted into a P-Well 202 provided on the P type silicon substrate 201, and is held to have a profile on which a position of a cross mark 212 shown in FIG. 1B is defined as a center.

Next, as shown in FIG. 1C, a desired resist pattern 213 having an opening for forming a P type transistor is used to perform "B" implantation at an acceleration energy of 40 KeV and a dosage of 2E12/cm$^2$ by using a well known ion implantation technique. At this time, the "B" ion passes through the polycrystalline silicon 209 and the gate oxide film 208, and is implanted into the N-Well 203 provided on the P type silicon substrate 201, and is held on a profile on which a position indicated by a cross mark 214 shown in FIG. 1C is defined as a center.

Figure 1D:
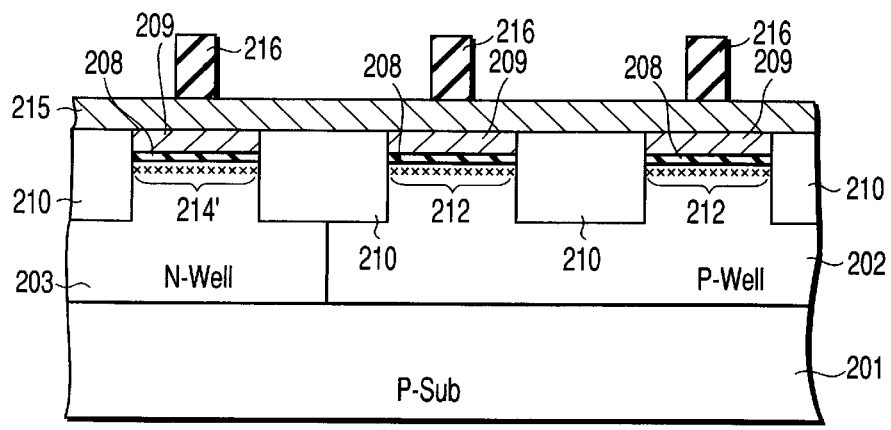

Next, the resist pattern 213 is released, a polycrystalline silicon film 215 of 315 nm in thickness is deposited by the well-known LP-CDV technique, and at the same time, a phosphor "P" is doped, as shown in FIG. 1D.

Next, in FIG. 1D, a resist pattern 216 is formed to have a desired gate electrode wiring pattern, and the polycrystalline silicon film 215 and polycrystalline silicon film 209 are etched so that a portions resided under the resist pattern 216 are remained.

Figure 1E:
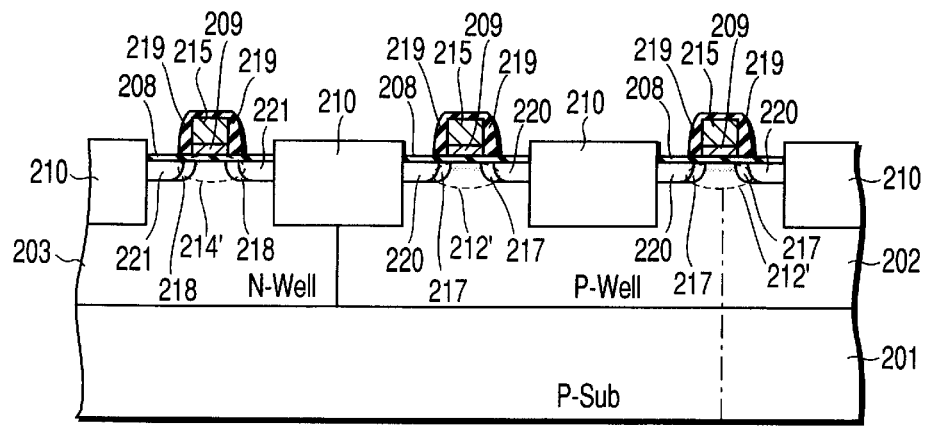

In this state, in order to form a side wall 219 on the side of the gate electrode consisting of the patterned films 209 and 215 in a well known process as shown in FIG. 1E, the subsequent side wall type transistor forming process is executed. That is, after a "P" ion and a "B" ion have been introduced in order to form LDDN-217, the side wall 219 of an insulation film is formed. Then, after the "As (arsenic)" ions for forming an N+ diffusion layer 220 and the "B" ions for forming the P+ diffusion layer 221 are introduced into the desired regions, respectively, the oxidization step at 800° C. and for about 60 minutes is carried out. In this heating step, the "P" ion and "B" ion for the LLDN-layer 217, the "As" ion for the LLDN-layer 220 and the "B" ion for the P+ diffusion layer 221 are activated, respectively, and the LDDN-layer 217, LDDP-layer 218, N+ diffusion layer 220, and P+diffusion layer 221 are formed. Thus, there is manufactured a semiconductor device in which a transistor has been allocated with high concentration in accordance with a gate prefabrication process.

In the formed semiconductor device, the "B" ions 214 and 212 implanted in the silicon substrate for channel control are treated at the slight heating process (800° C., 30 minutes) for forming the diffusion layer as the merely heating step after ion implantation.

On the other hand, in a conventional art as shown in FIG. 12A to FIG. 12D, in addition to the heating process employed for forming the diffusion layer, there exists a heating step when the gate insulation film is formed, i.e., a high temperature heat treatment process concerning the formation of the element isolation insulation film after a part of the gate electrode has been formed. As a result, it was not obtained a sharp profile of impurities in the vicinity of the surface of a transistor channel portion in the conventional art. On the contrary, only a heat treatment process for ion activation in the present invention makes it possible to form a desired very sharp impurity profile.

Figure 2:
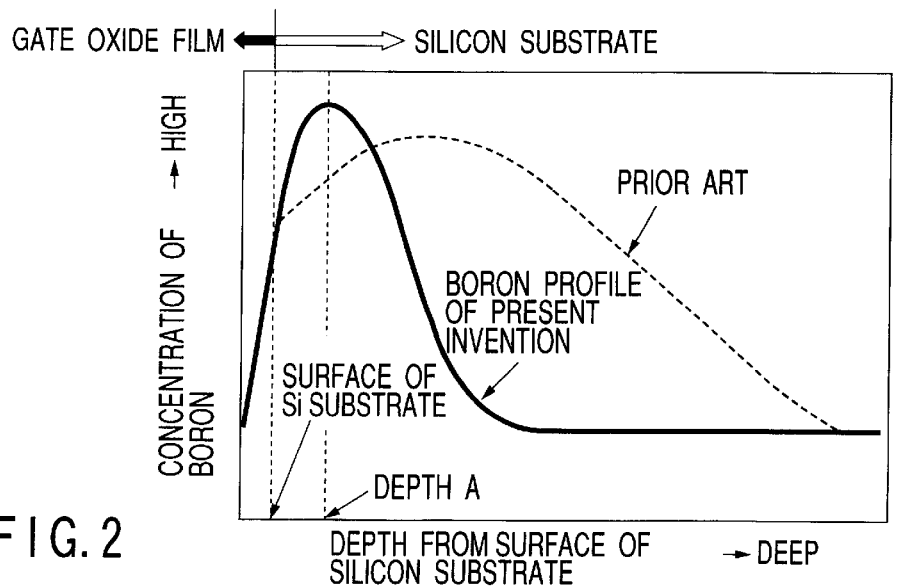
FIG. 2 is a view showing an impurity concentration profile of a transistor channel portion.

FIG. 2 shows an example of the "B" profile at an N type transistor portion according to the present invention as compared with the conventional example. The axis of ordinates indicate a concentration "B" in the vicinity of the surface implemented for the purpose of channel control introduced into the silicon substrates 101 and 201; and the abscissa indicates a position in the depth direction from the surface of the silicon substrates. Conventionally, it is found that the "B" ion 107 implanted for channel control diffuses to the depth in the silicon substrate 201 in accordance with the heating step after the "B" ion 107 has been implanted into the silicon substrate 201. On the other hand, when the technique according to the present invention is employed, a limited heat step is used, and the "B" ion implanted into the silicon substrate 201 does not diffuse to the depth of the silicon substrate 201. Thus, it is found that a desired sharp profile can be easily formed.

Hereinafter, an effect achieved by profile achievement shown in FIG. 2 will be briefly described. As shown in FIG. 2, the desired "B" profile achieved according to the present invention has a peak at a depth A (about 0.2 μm) that is slightly shallow from the surface, and lowers to the value in that of the P-Well more steeply as the profile becomes deeper. On the other hand, in a direction oriented to the surface, a profile on which the concentration rapidly drops from the depth A is controlled. As characteristics of the profile on which the "B" ion concentration rapidly lowers in the depth direction of the substrate, there is known an effect that a substrate bias effect is reduced (refer to an article by Masatake Kishino and Mitsumasa Koyanagi, Physics of VLSI device, Maruzen, pp. 115–121). A rise of threshold value of the transistor due to the substrate bias effect is minimized, thus enabling high speed transistor operation.

Figure 4:
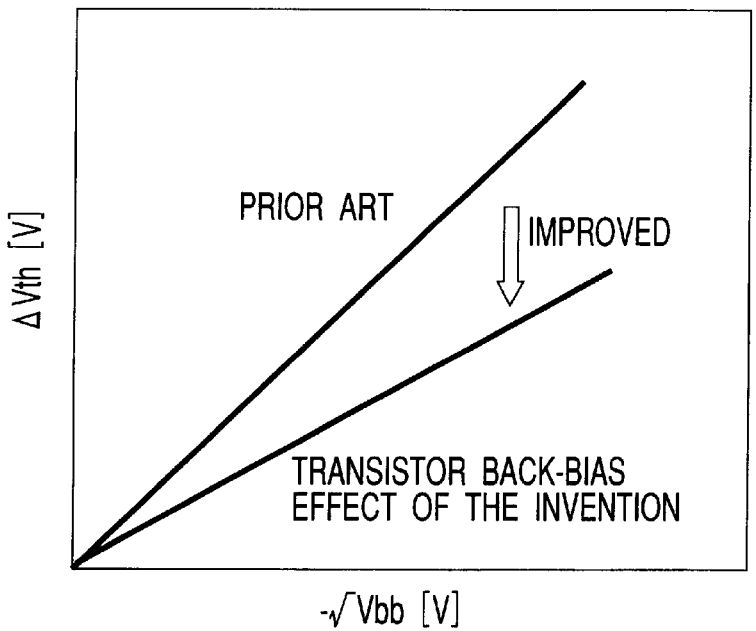
FIG. 4 is a view showing a back bias effect of the transistor manufactured according to the present invention as compared with a conventional transistor.

On the other hand, in the case of a profile on which "B" ions with its high concentration are uniformly distributed to the deep portion of the substrate as in the conventional example, a back bias effect is severe, high speed transistor operation is impaired. Depending on the threshold value of the transistor that has risen due to the back bias, switching operation may be disabled. According to the present embodiment, as a back bias effect reduction effect, a rise of threshold value is reduced by about ⅔ as compared with the conventional example (refer to FIG. 4). In addition, it is a widely known fact that the concentration peak of "B" at the depth A of about 0.2 μm is effective in punch through restriction or short channel effect restriction without a rise of a surface concentration or a transistor threshold value. In addition, in the case of a P type transistor, although not illustrated in detail, it is a well known fact that an excellent short channel effect is provided by controlling a channel on the surface of a silicon substrate 201 so that a peak of the "B" ion concentration is present in a shallow region.

Figure 3:
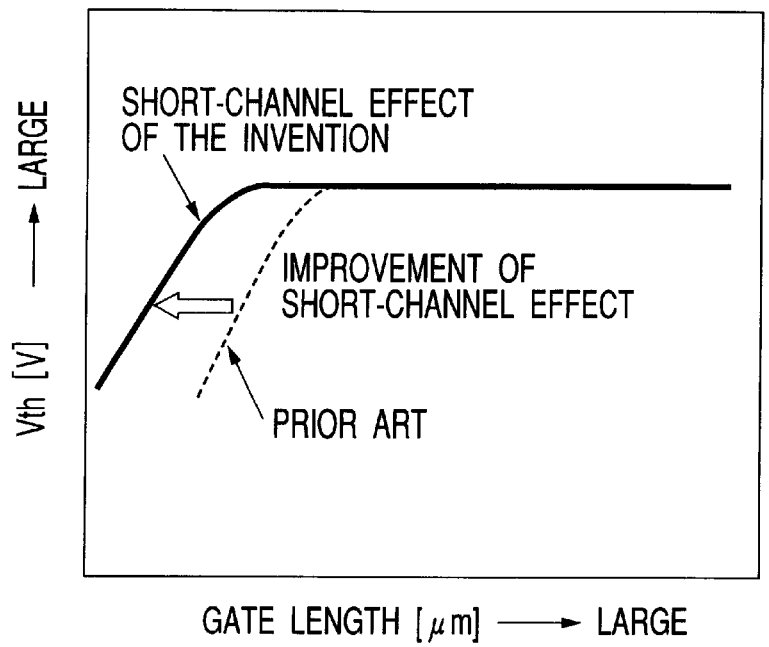
FIG. 3 is a view showing a short channel effect of a transistor manufactured according to the present invention as compared with a conventional transistor.

FIG. 3 shows a short channel effect of a P type transistor on a profile achieved according to the present invention, which is compared with the conventional example. The figure shows that a Vth down due to a short channel effect is improved to enable the reduction of a gate length by about 0.1 μm.

The manufacturing method according to the present invention is applicable to any of the N type transistor and P type transistor, and these transistors may be applied, respectively, according to achievement of a desired element.

Therefore, there is no need to form all the transistors that exist on the same substrate according to the manufacturing method of the present invention. The present invention is selectively applicable to a required element.

During transistor channel control, a polycrystalline silicon film 209 through which an impurity ion passes is about 50 nm in thickness. Thus, acceleration energy required for ion implantation is as small as of about 100 KeV, diffusion generated during ion implantation or an effect due to a channeling phenomenon can be ignored. Therefore, a more controlled sharp channel profile can be achieved according to the present invention.

In addition, although "B" is employed as impurities for ion implantation for the purpose of channel control, there is no need to limit to the "B". For example, P (phosphor), As (arsenic), In (Indium) or the like may be employed. In addition, a high melting point metal is pasted instead of a second polycrystalline silicon film 215 to make a polyside film or polymetal film between the high melting point metal and a first polycrystalline silicon film 209, whereby a gate electrode wiring resistance can be reduced.

(2) Second Embodiment

Figure 5A:
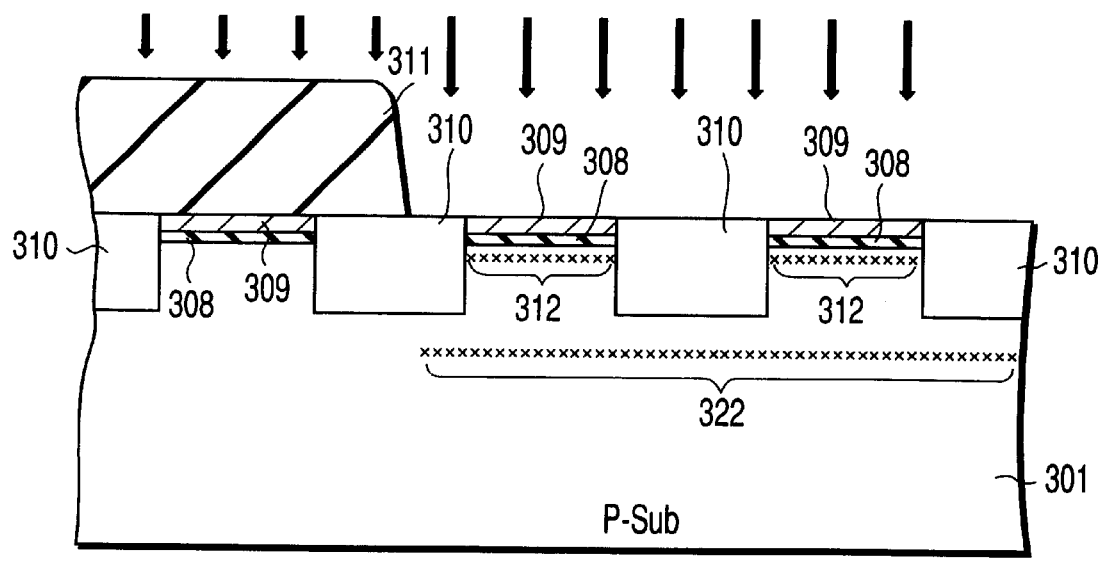
FIG. 5A and FIG. 5B are views showing the steps of manufacturing a semiconductor device by applying the manufacturing method according to the present invention.

Now, a second embodiment will be described here with reference to FIG. 5A and FIG. 5B. The second embodiment improves the first embodiment so that it can be achieved with a smaller number of manufacturing steps. Through the steps similar to those of the first embodiment, there are formed an oxide film 310 that is an insulation film for element isolation on the silicon substrate 301 and a gate insulation film 308 on which a polycrystalline silicon films 309 is formed. At this time, regions equivalent to N-Well 203 and P-Well 202 shown in FIG. 1A are not formed on a silicon substrate 301, thus eliminating the corresponding process.

Next, after a resist pattern 311 covering at least a region for forming a P type transistor is formed, a B (boron) ion is first introduced into the silicon substrate 301 at an acceleration energy of 400 KeV, at a dosage of $2E13/cm^2$, and then at 100 KeV, and at a dosage of $5E12/cm^2$, respectively, by using an ion implantation technique. Then, there are formed a "B" ion implanted group 322 that exists at a position deeper than the bottom of an element isolation region 310 and a "B" ion implanted group 312 that exists at a shallow position with respect to the element isolation region 310.

Figure 5B:
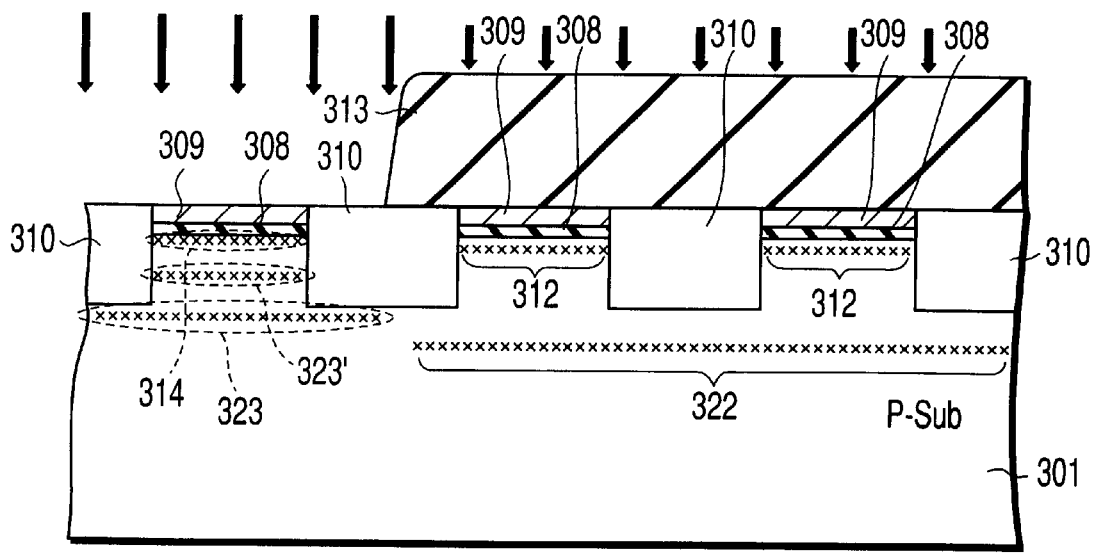

Next, as shown in FIG. 5B, a resist pattern 313 covering at least a region for forming an N type transistor is formed. Then, with the resist pattern 313 being as a mask, a "P" (phosphor) ion is first implanted at an acceleration energy of 2 MeV and at a dosage of $5E12/cm^2$; then a "P" ion is implanted at an acceleration energy of 160 KeV and at a dosage of $5E13/cm^2$; and at last a "B" (boron) ion is implanted at an acceleration energy of 40 KeV and at a dosage of $2E12/cm^2$ sequentially, so that a "p" ion implanted group 323 that exists at a position deeper than the element isolation region 310, a "P" ion group 323' that exists between the element isolation regions 310 with the intermediate depth, and a "B" ion group 314 that exists immediately beneath the gate oxide film 308, respectively, are formed.

Hereinafter, as a first embodiment, as shown in FIG. 1D and FIG. 1E, a semiconductor device in which transistors are allocated with high concentration can be manufactured in accordance with a gate prefabrication process through the similar process.

The electrical characteristics of transistors manufactured as described above are similar to those shown as the first embodiment. As compared with a conventional example, there can be formed: an N type transistor in which a back bias effect is restricted, and a gate length is reduced without a rise of Vth; and a P type transistor in which a significant short channel effect restriction has been achieved.

The second embodiment is different from the first embodiment in which, at the steps shown in FIG. 1B and FIG. 1C, during ion implantation of B (boron) for the purpose of N transistor threshold value control and B (boron) for the purpose of P type transistor threshold value control, forming of a B (boron) ion implanted group 322 corresponding to P-Well forming and a boron ion implanted group 312 for the purpose of channel control is carried out merely by changing implantation conditions, respectively, at the identical ion implantation step. And, at the next ion implantation step, ion implantation is carried out for the purpose of introduction of the ion implantation of the P (phosphor) ion implanted group 323 and ion group 323' corresponding to N-Well forming and for the purpose of introduction of the boron ion implanted group 314 for the purpose of channel control. Therefore, as compared with the first embodiment, manufacturing cost reduction caused by process simplification can be achieved by eliminating a resist forming process and a resist release process for P-Well forming and a resist forming process and a resist release process for N-Well forming.

(3) Third Embodiment

Figure 6A:
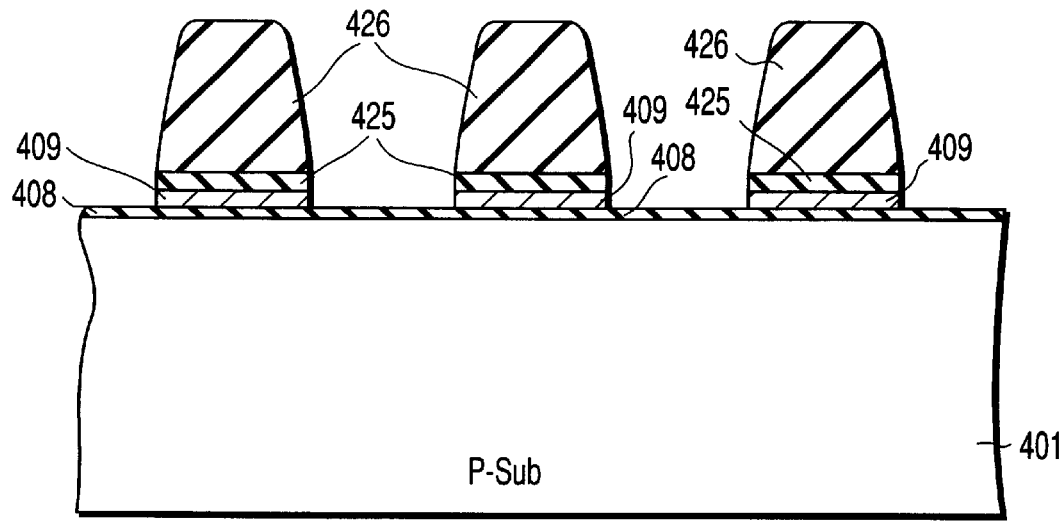
FIG. 6A and FIG. 6B are views showing the steps of manufacturing a semiconductor device by applying the manufacturing method according to the present invention.

Now, a third embodiment will be described with reference to FIG. 6A and FIG. 6B and FIG. 7A and FIG. 7B. In FIG. 6A, as in the first embodiment, a gate oxide film 408 of 10 nm in thickness is formed on a silicon substrate 401, on which a polycrystalline silicon film 409 of 50 nm in thickness having P (phosphor) doped therein is deposited, and further, a TEOS film 425 of 100 nm in thickness is deposited.

Figure 6B:
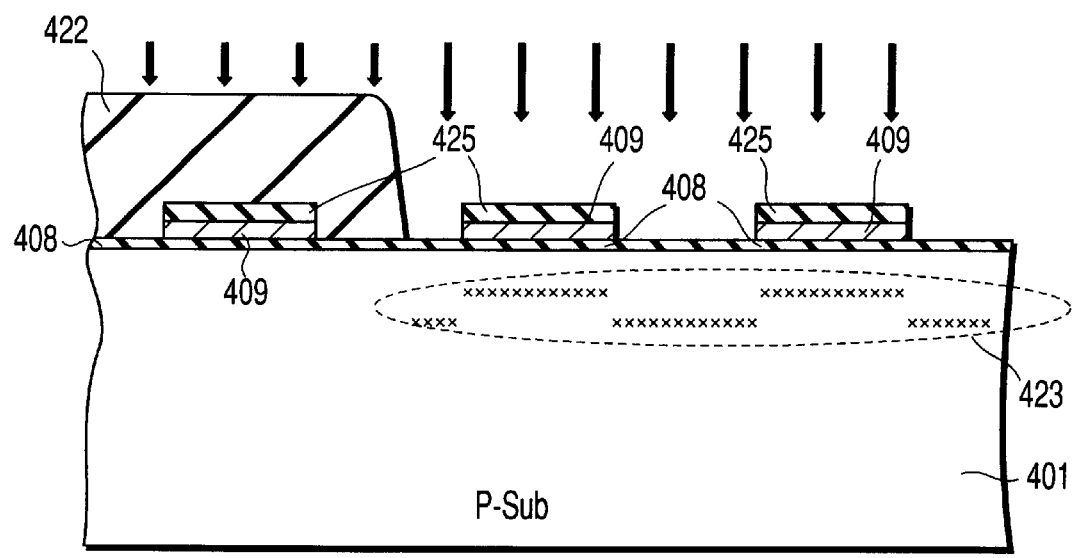

Next, the TEOS film 425 and the polycrystalline silicon film 409 are etched by using a resist pattern 426 in which a desired predetermined region for forming an element isolation region is opened. Next, as shown in FIG. 6B, a desired resist pattern 422 covering at least P type transistor forming region is formed, and using the resist pattern 422 and the TEOS film 425 as a mask, a B (boron) ion is implanted at an acceleration energy of 200 KeV and at a dosage of $2E13/cm^2$. As a result, as shown in FIG. 6B, a boron ion implanted group 423 is formed in the same time to be shallow at a region at which the TEOS film 425 exists and to be deeper than at a region at which an opening exists.

In addition, in a region for forming a P type transistor as well, likewise, while an N type transistor forming region is covered with a desired resist pattern, the TEOS film 425 is used as a mask, and a P (phosphor) ion is implanted at an acceleration energy of 1.5 MeV and at a dosage of $5E12/cm^2$.

Figure 7A:
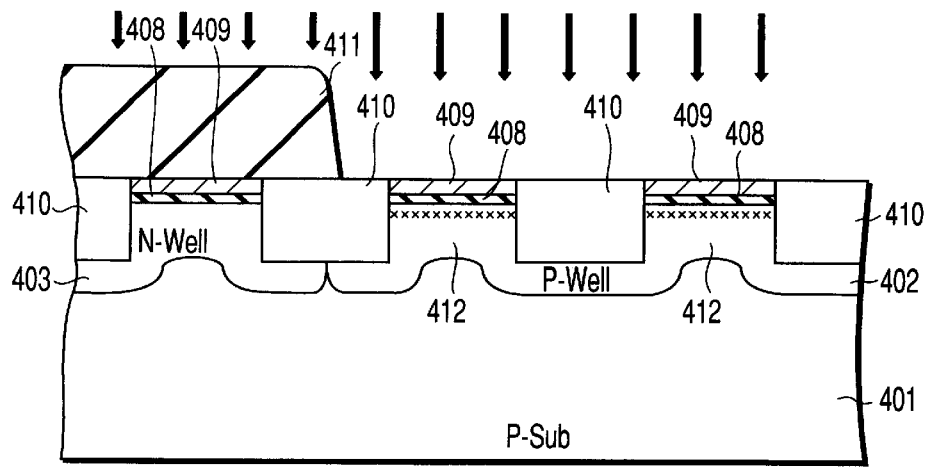
FIG. 7A and FIG. 7B are views showing the steps of manufacturing a semiconductor device by applying the manufacturing method according to the present invention.
Figure 7B:
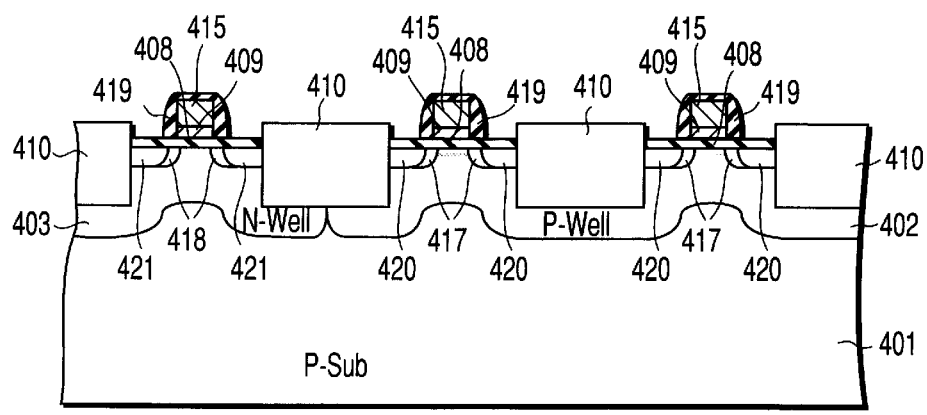

Next, as in the first embodiment, as shown in FIG. 7B, using the TEOS film 425 as a mask, the gate oxide film 408 and P type silicon substrate 401 that exist in a region for forming an element isolation region are etched away to form a trench 410T of 0.4 $\mu$m in depth is formed. Then, a silicon oxide film 410 of 1.5 microns in thickness is deposited in the trench 410T as an element isolation insulation film by a well known plasma CVD technique. Then, the silicon oxide film 410 is subject to densifying process at 1050° C. and for 60 seconds. With the subsequent CMP technique, the silicon oxide film 410 is selectively remained as a buried film in a trench 410T provided in the P type silicon substrate 401.

At this time, by the heating step applied to the silicon oxide film 410, B (boron) and P (phosphor) ions implanted into the silicon substrate 401 are activated, respectively, in the subsequent step following the step of FIG. 6B, and are obtained as P-Well 402 and N-Well 403 in FIG. 7A.

Next, in FIG. 7A, as in the first embodiment, for the purpose of transistor channel control, in a predetermined region for forming a desired N type transistor, using the resist pattern 411 as a mask, the "B" ion is ion implanted at an acceleration energy of 100 KeV and at a dosage of $5E12/cm^2$.

On the other hand, in a predetermined region for forming a P-type transistor as well, similarly, for the purpose of transistor channel control, using a desired resist pattern as a mask, a "B" ion is implanted at an acceleration energy of 40 KeV and at a dosage of $2E12/cm^2$.

Next, a semiconductor device in which a transistor with its high concentration is disposed in accordance with a gate prefabrication process is prepared through the steps similar to the first embodiment. There is an advantage that a material formed at the above steps can be formed in a region in which P-Well 402 and an N-Well 403 are present at shallow region, as shown in FIG. 7B, as compared with that according to the first embodiment, and a junction capacity of the respective wells 402 and 403 and the silicon substrate 402 can be reduced. Therefore, a configuration that enables a high speed circuit operation can be provided.

Although the present embodiment has an effect similar to that of the second embodiment, impurity ion implantation conditions for forming a well exemplified in the third embodiment will suffice at a comparatively low acceleration energy, and thus, the limitation (capability) of an available manufacturing device may be low. In addition, the second embodiment requires several P (phosphor) ion implantation when N-Well is formed. In contrast, the third embodiment requires only a small number of P (phosphor) ion implantation steps and heating steps of about 1050° C. and 60 seconds. Thus, desired gentle well profile can be easily designed. Moreover, a crystal defect generated during ion implantation is easily recovered, and a junction leakage can be reduced to a low level, which is effective in application to a low power consumption semiconductor device.

In FIG. 7B, a polycrystalline silicon film 409 through which an impurity ion passes for transistor channel control is obtained to have a thickness of about 50 nm. Acceleration energy required during ion implantation of impurities implanted in the vicinity of the surface of a silicon substrate 401 that is the most important in transistor control is obtained as a maximum of 100 KeV, and the diffusion generated during ion implantation or an effect due to a channeling phenomenon can be ignored. Thus, a more controlled channel profile can be achieved.

(4) Fourth Embodiment

Figure 8:
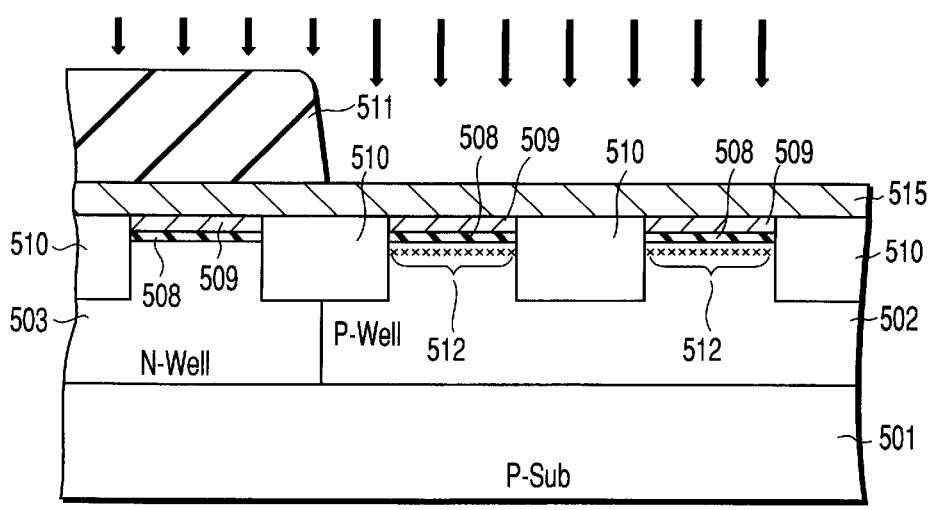
FIG. 8 is a view showing the step of manufacturing a semiconductor device by applying the manufacturing method according to the present invention.

Now, a fourth embodiment will be described in detail with reference to FIG. 8. In the first embodiment, for the purpose of threshold value control of an N type transistor and a P type transistor, impurities are introduced into a substrate by ion implantation so as to pass through a polycrystalline silicon film 209 of 50 nm in thickness. In a forth embodiment, after a silicon oxide film 510 has been buried in a trench 510T provided in the silicon substrate 501 for the purpose of element isolation, unlike the first embodiment in which impurities are introduced by ion implantation so as to pass through the polycrystalline silicon film 209 for the purpose of N type transistor and P type transistor threshold value control. Instead, while a resist pattern 511 is used as a mask, via a second polycrystalline silicon film 515 of 250 nm in thickness, a B (boron) ion is implanted in a prede- termined region for forming an N type transistor at an acceleration energy of 130 KeV and at a dosage of $5E12/cm^2$. On the other hand, the "B" ion is implanted in the region for forming a P type transistor at an acceleration energy of 70 KeV and at a dosage of $2E12/cm^2$. Thereafter, as in the first embodiment, a side wall type transistor as shown in FIG. 1E is formed.

In this manner, as in the first embodiment, as compared with the conventional example, a back bias effect restriction or short channel effect restriction can be achieved. However, as compared with the first embodiment, for the purpose of N type and P type transistor threshold value control, ion implantation conditions for implanting impurities requires high acceleration energy. Thus, the diffusion of ion implantation may increase, and there appears a phenomenon that a transistor threshold value dispersion slightly increases. However, this phenomenon can be well tolerated according to uses. This is because, for the purpose of N type and P type transistor threshold value control, the polycrystalline silicon film thickness during introduction of impurities (ion implantation) is reduced to about 300 nm at a total of a first polycrystalline silicon film 509 and a second polysilicon film 515. If a total of the film thickness of the first polysilicon film 509 and the second polysilicon film 515 increases to about 400 nm, it should be noted that there occurs a dispersion in transistor threshold values due to the ion diffusion caused by ion implantation or due to a degree of channeling.

(5) Fifth Embodiment

Now, a fifth embodiment will be described in detail with reference to FIG. 9A to FIG. 9D. In the first to fourth embodiments and the sixth and seventh embodiments described later, the present invention is applied to a nonvolatile memory device that is a semiconductor device suited for a gate prefabrication process and emphasizing a back bias effect as a more effective device, a desired high performance transistor is provided, and high speed circuit operation and a boosting power circuit can be minimized. Further, in the fifth embodiment described later, there is shown a specific example when the present invention is applied to an N type transistor of a peripheral circuit portion in an NAND type flash memory in order to reduce a back bias effect that is a significant effect of the present invention as one of specific applications to a nonvolatile memory. In the NAND type, in write/erase operation, a high voltage power supply of 20 bolts is used, for example, and, of course, a gate oxide film thickness of 40 nm is used for a part of the peripheral transistors for controlling a memory cell in order to ensure the reliability of the gate oxide film. In general, it is known that a thick gate oxide film makes a back bias effect severe, and the present invention is applied to an N type transistor with its large film thickness in order to improve this fact.

In FIG. 9A, as in the first embodiment, an N-Well 603 and a P-Well 602 are formed on a P type silicon substrate 601. An N-Well 630 and a cell P-Well 631 required for configuring a cell transistor are formed in a predetermined region for forming a cell transistor. Specifically, P (phosphor) ions are first implanted into a predetermined region for forming the cell N-well 630 at an acceleration energy of 2 MeV and at a dosage of $5E12/cm^2$, and then are implanted at an acceleration energy of 160 MeV and at a dosage of $5E13/cm^2$, respectively. In addition, a B (boron) ion is formed by implanting into a predetermined region for forming the cell P-Well 631 at an acceleration energy of 400 KeV and at a dosage of $2E13/cm^2$.

Next, a silicon oxide film 608 of 8 nm in film thickness is formed on the P type silicon substrate 601, and a silicon oxide film 632 of 40 nm in oxide film thickness is formed at a desired region, respectively. Of course, a thicker gate oxide film 632 can be formed in a transistor region to which a high potential is applied for write/erase operation of a memory cell.

Next, a polycrystalline silicon film 609 that is a part of a gate electrode is formed through the steps that are similar to those according to the first embodiment, and a silicon oxide film 610 is buried in a trench 610T of an element isolation region. Thereafter, as in the first embodiment, a B (boron) ion is implanted through a polycrystalline silicon film 609 that is a part of the gate electrode and the gate oxide film 608 so as to produce a desired transistor channel profile. In particular, even in the cell transistor region 631, a high concentration is required by fining a cell configuration. Thus, the B (boron) ion is implanted at an acceleration energy of 80 KeV and at a dosage of $5E13/cm^2$ that are conditions for achieving a desired channel portion profile through the polycrystalline silicon film 609 and the gate insulation film 608.

In addition, in a transistor region to which a high potential is applied, a B (boron) ion is implanted at an acceleration energy of 100 KeV and at a dosage of $3.0E12/cm^2$ by using a resist pattern 633. As shown in FIG. 9A, in a transistor region in which a thick gate oxide film 632 having the high potential applied thereto is formed, a P-Well region or equivalent thereto is not formed in order to maximize a back bias restriction effect.

Next, as shown in FIG. 9B, after the resist pattern 633 has been removed, a polycrystalline silicon film 615 of 150 nm in thickness is deposited. Then, a part of the polycrystalline silicon film 615 is etched, thereby forming an opening 615A.

Figure 9C:
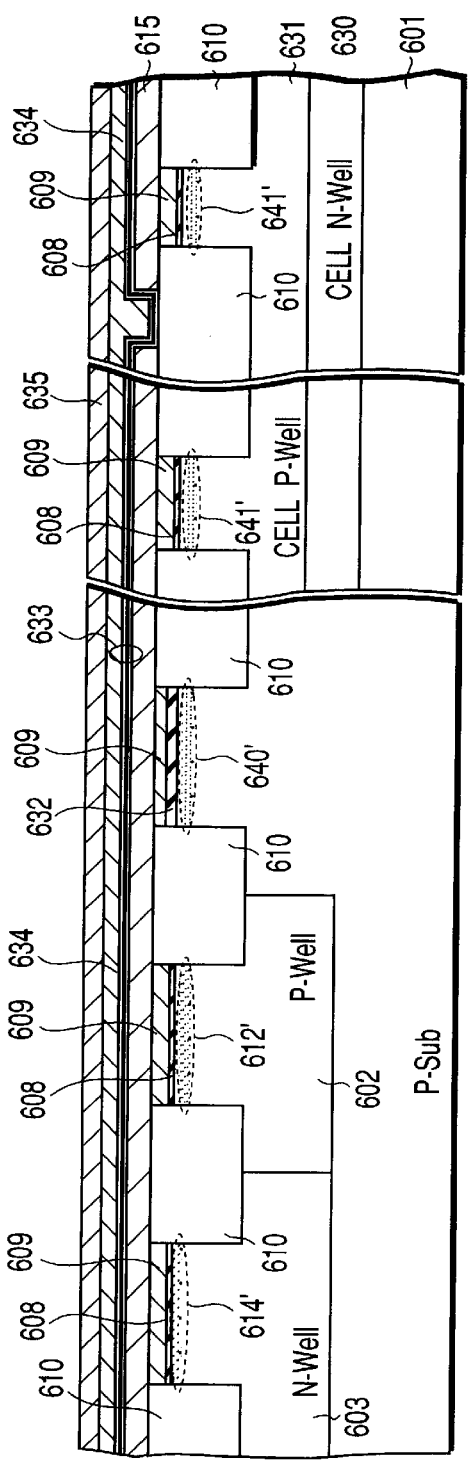

Next, as shown in FIG. 9C, after a TEOS film of 10 nm in thickness has been entirely deposited, a silicon nitride film of 10 nm in thickness is deposited by a well known LP-CVD technique. Further, a TEOS film of 10 nm in thickness is deposited, whereby an ONO composite film 633 is formed as a second gate oxide film in contact with an element isolation region 610 at the opening 615A as shown in FIG. 9C.

Next, as shown in FIG. 9C, a P-doped polycrystalline silicon film 634 of 20 nm in thickness is deposited, and further, a WSi film 635 of 200 nm in thickness is deposited on the silicon film 634.

Subsequently, as shown in FIG. 9C, the WSi film 635, polycrystalline silicon film 634, ONO composite film 633 and polycrystalline silicon film 615, and polycrystalline silicon film 609 are etched to form a desired gate electrode wiring pattern. Then, the WSi film 635 and polycrystalline silicon film 634 that exist in a predetermined region for forming a gate electrode terminal of a transistor that configures the peripheral circuit other than cell transistor is released.

Figure 9D:
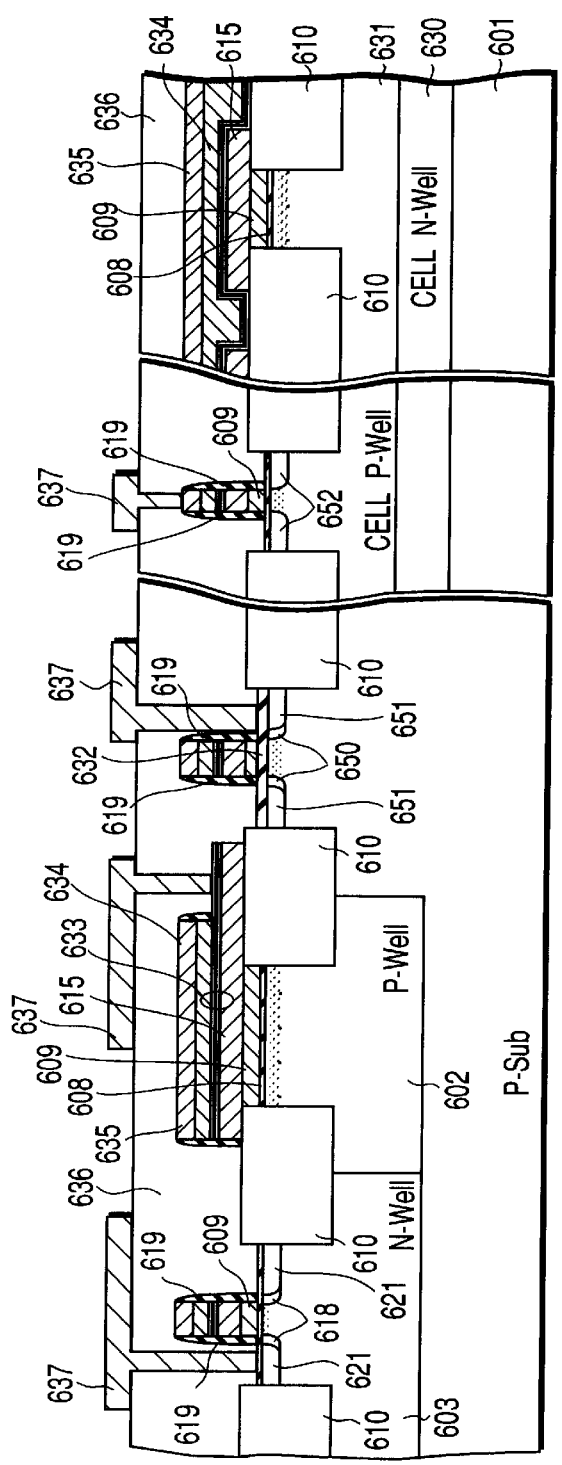

Next, like a well known LDD type transistor forming technique, as shown in FIG. 9D, the LDD diffusion layers 618 and 650 and the diffusion layers 621 and 651 are formed, and at the same time, a diffusion region 652 that configures a cell transistor is formed. Further, a side wall 619 is formed. Thereafter, a BPSG film 636 of 600 nm in thickness is formed as a protection film through which a contact hole is formed, and then, a desired Al wiring pattern 637 is formed.

In the thus manufactured NAND type flash memory device, even if an MOSFET that operates in a comparatively high back bias state on write/erase operation is used, it is possible to restrict a rise of Vth caused by a back bias effect to the minimum, and it is possible to simplify a capacity element that configures a charge pump circuit, whereby a chip size can be reduced.

In addition, in the structure shown in FIG. 9D, in a cell transistor as well, there is employed a technique according to the present invention in which channel control is achieved by ion implanting through the polycrystalline silicon film 609 which operates as a part of a floating gate electrode. In this case as well, a cell transistor driving capability is improved due to restriction of a back bias effect, thereby facilitating ON/OFF detection easily by a sense amplifier circuit and leading to improvement of high speed operation or reliability. Of course, the easiness of channel profile control makes it possible to reduce the gate length as in the peripheral transistors, enabling high concentration of a memory cell.

The present embodiment is particularly effective to a transistor requiring back bias restriction in which a back bias potential of about 20 bolts is applied. In addition, in comparison with a conventional channel control during ion implantation for forming a well, in embodiments shown in FIG. 1A to FIG. 1E, FIG. 6A and FIG. 6B, FIG. 7A and FIG. 7B, and FIG. 8 according to the present invention, the number of manufacturing steps slightly increases because the steps of well formation for forming transistors and the steps of providing transistor channel control through a part of a gate electrode are separately carried out. However, in a case when a usage of a transistor is not limited to a circuit with a severe back bias effect limitation in a well, as compared with a conventional example, there can be provided a transistor with its excellent back bias effect restriction, high performance, and fineness without any increase in manufacturing steps.

(6) Sixth Embodiment

Now, a sixth embodiment will be described with reference to FIG. 10A to FIG. 10C. The present embodiment shows a modified example of the first to fifth embodiments.

First, in FIG. 10A, after a silicon oxide film 704 of 10 nm in thickness has been formed on a P type silicon substrate 701, a B (boron) ion is implanted at an acceleration energy of 60 KeV and a dosage of $4E12/cm^2$, thereby forming a boron ion implanted group 707 at a shallow portion of the substrate 701. Then, a B (boron) ion is implanted at an acceleration energy of 60 KeV and at a dosage of $2E13/cm^2$, thereby forming a boron ion implanted group 702'.

Next, as shown in FIG. 10B, after the silicon oxide film 704 has been released, a polycrystalline silicon film 709 of 50 nm in thickness is deposited, and at the same time, "P" is doped in the silicon film 709. At this time, the implanted B (boron) ion implanted group 702' is activated in a silicon substrate 701, a P-Well 702 is formed in correspondence to a boron ion implanted group 702', and a region 707' with dense impurities corresponding to the boron ion implanted group 707 is formed in the vicinity of the surface of the substrate 701.

Next, as shown in FIG. 10C, as in the first embodiment, after an element isolation region 710 has been provided, a resist pattern 711 provided in a region other than a predetermined region for forming an N type transistor having at least a second threshold value is employed as a mask, and a boron ion is implanted at an acceleration energy of 100 KeV and at a dosage of $2E12/cm^2$.

Subsequently, as in the first embodiment, a semiconductor device is manufactured through a well known process for forming a side wall type transistor. As a result, a controlled channel profile by using the conventional technique is provided in a predetermined region for forming an N type transistor having the first threshold value. With respect to an N type transistor having a second threshold value, a transistor profile is controlled with impurities obtained by combining B (boron) that passes through the polycrystalline silicon film 709 with impurities introduced using the conventional technique.

In the semiconductor device manufactured as described above, the same conductivity type transistors with their different threshold values exist on the same substrate, and the associated steps include the ion implantation step and the mask (resist pattern) forming step required during the ion implantation in number corresponding to the number of threshold values. However, according to the present embodiment, when a transistor having a first threshold value to be controlled using the conventional technique is formed, at the same time, impurities are also implanted in the same conductivity type transistor region having a second threshold value. Thus, the impurity introducing step for forming a P-Well required for forming the transistor having the second threshold value is eliminated, thus making it possible to reduce the number of manufacturing steps to the minimum.

Not only N type transistors but P type transistors having a plurality of threshold values may be provided on the same substrate in a combination similar to the above.

(7) Seventh Embodiment

Now, a seventh embodiment will be described in detail with respect to FIG. 11A and FIG. 11B. The present embodiment shows a modified example of the first to fifth embodiments. First, in FIG. 11A, after an N-Well 803 has been provided on a P type silicon substrate 801, a silicon oxide film 808 of 8 nm in thickness and an oxide film 832 of 40 nm in film thickness are formed in a desired region. Next, a polycrystalline silicon film 809 that is a part of a gate electrode is formed through the steps similar to those according to the first embodiment. After a silicon oxide film 810 has been buried in an element isolation region, as in the first embodiment, a B (boron) ion is implanted through the polycrystalline silicon film 809 that is a part of the gate electrode so as to produce a desired transistor channel profile. Subsequently, as in the first embodiment, a semiconductor device is manufactured through a well known process for forming a side wall type transistor.

In the thus manufactured semiconductor device, although a plurality of transistors with their different gate oxide film thickness exist in the same substrate, a transistor channel control is achieved on the identical well, and at the surface of silicon substrate, the ion implantation step through the polycrystalline silicon film 809 using the technique according to the present invention is performed at the same step.

In the case where there exists a transistor having different gate oxide film thickness of about 8 nm and about 40 nm, in transistor channel control using the conventional technique, the threshold value could not be adjusted within a transistor operable range during introduction of the same impurities. However, as shown in FIG. 11A and FIG. 11B, when the technique according to the present invention is used, a deformation of a channel profile caused by the heating step can be minimized, and thus, desired channel control can be achieved. As a result, this makes it possible to adjust the threshold value within the transistor operable range. As shown in FIG. 11B, it is possible to obtain suitable threshold values only in accordance with the identical transistor channel control step with respect to transistors having different gate oxide film thickness of about 8 nm and about 40 nm, which has been conventionally impossible.

Conventionally, although impurities has been ion implanted by providing different masks on different gate oxide films having different thickness, use of the technique according to the present invention which achieves a controlled profile does not always make it necessary to provide the mask forming steps and impurity introducing steps for each of the transistors having different gate oxide film thickness at the step of ion implanting the same impurities. Thus, a manufacturing cost can be reduced.

As has been described above in detail, according to the present invention, a desired channel profile control can be easily and reliably achieved. For example, in an N type transistor, it is confirmed that a back bias effect is significantly restricted, and such restriction is within the range of a Vth rise of about ⅔ as compared with the conventional example. In addition, a short channel effect/punch through leak is restricted, and the gate length is reduced to the minimum. When the present invention is applied to form a P type transistor, a particular effect is obtained and the gate length thereof can be reduced by about 0.1 $\mu$m. Thus, a semiconductor device with its high speed, high performance, and high concentration is achieved. In particular, the present invention is applicable to a two-layered gate electrode type transistor used as a memory cell, in which an electrode terminal is mounted at a first gate electrode material via a gate oxide film provided on a semiconductor substrate so as to use such a type transistor as one functioning as a general transistor (Y. Takeuchi et al., 1998, Symposium on VLSI Technology Digest of Technical Paper, pp. 102 to 103). In addition, when a two-layered gate electrode type transistor is formed on the same substrate together with a memory cell, there exists an N type transistor to which a high potential is applied during memory cell write/erase operation. A semiconductor device manufactured by applying the present invention can include an N type transistor to which the high potential is applied. As a result, a back bias effect is significantly restricted, and the charge transfer efficiency in the charge pump circuit is improved, making it possible to reduce a chip size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:

forming a gate oxide films of MOS type transistors on an element forming region of a semiconductor substrate;

forming a conductive films that configure parts of a gate electrodes on the gate oxide films; and implanting impurities in the semiconductor substrate through the conductive films and the gate oxide films to form a concentration peak of the impurities in set regions in the semiconductor substrates, wherein a depth from an upper surface of the conductive films to the set regions in the semiconductor substrate is substantially equal in the element forming region.

2. A semiconductor device manufacturing method comprising:

forming a gate oxide films of MOS type transistors on an element forming region of a semiconductor substrate;

forming a conductive films that configure parts of a gate electrodes on the gate oxide films;

removing a part of the gate oxide films and the conductive films formed on a predetermined region of the semiconductor substrate corresponding to element isolation region forming areas provided for defining the element forming region;

forming trenches in the semiconductor substrate at the element isolation region forming areas from which the parts of the gate oxide films and the conductive films are removed;

burying element isolation oxide layers in the trenches; and implanting impurities into the semiconductor substrate through the conductive films and the gate oxide films to form a concentration peak of the impurities in set regions in the semiconductor substrate, wherein a depth from an upper surface of the conductive films to the set regions is substantially equal in the element forming region.

3. (Currently Amended) A semiconductor device manufacturing method comprising:

forming a gate oxide films of MOS type transistors on an element forming region of a semiconductor substrate;

forming a first conductive films that configure at least parts of a MOS type transistor gate electrodes on gate oxide films;

forming an etching stopper films having etching selectivity with respect to the semiconductor substrate on the first conductive films;

forming a resist patterns in regions other than a predetermined region for forming element isolation films on said etching stopper films;

removing said etching stopper films and said first conductive films by using said resist patterns as a-mask masks;

releasing said resist patterns provided on said etching stopper films; and implanting impurities into said semiconductor substrate through the first conductive film and the gate oxide film to form a concentration peak of the impurities in set regions in the semiconductor substrate, wherein a depth from an upper surface of the first conductive films to the set regions is substantially equal in the element forming region.

4. A semiconductor device manufacturing method comprising:

forming a gate oxide films of a MOS type transistors on an element forming region of a semiconductor substrate;

forming a first conductive films that configure at least parts of a MOS type transistor gate electrodes on said gate oxide film films;

forming etching stopper films having etching selectivity with respect to said semiconductor substrate on said first conductive films;

forming a resist patterns in a region other than a predetermined regions for forming element isolation films on said etching stopper films;

removing said etching stopper films and said first conductive films by using said resist patterns as masks;

releasing said resist patterns provided on said etching stopper films;

implanting impurities to first portions on said semiconductor substrate;

forming trenches in said predetermined regions for forming element isolation regions of said semiconductor substrate;

burying oxide layers in said trenches and removing said etching stopper films provided on said first conductive films; and implanting impurities into said semiconductor substrate through said first conductive films and said gate oxide films to form a concentration peak of the impurities in set regions in the semiconductor substrate, wherein a depth from an upper surface of the first conductive films to the set regions is substantially equal in the element forming region.

5. A semiconductor device manufacturing method comprising:

forming an oxide film on a semiconductor substrate;

introducing first impurities into said semiconductor substrate through said oxide film;

removing said oxide film, followed by forming gate oxide films of a MOS type transistors on said semiconductor substrate;

forming first conductive films that configure at least parts of a MOS type transistor gate electrodes on said gate oxide films;

removing said first conductive films and said gate oxide films that exist in a predetermined regions for forming element isolation regions, followed by forming trenches on said semiconductor substrate of said predetermined regions;

burying an oxide layers in said trenches; and implanting second impurities into said semiconductor substrate through said first conductive films and said gate oxide films to form a concentration peak of the second impurities in set regions in the semiconductor substrate, wherein a depth from an upper surface of the first conductive films to the set regions is substantially equal in an element forming region defined by the element isolation forming regions.

6. A semiconductor device manufacturing method in which a first conductivity type transistor has a first threshold value and a first conductivity type transistor has a second threshold value on a semiconductor substrate, said manufacturing method comprising:

forming an oxide film on said semiconductor substrate;

introducing first impurities in a first predetermined region for forming a first conductivity type transistor having a first threshold value and a second predetermined region for forming a first conductivity type transistor having a second threshold value via said oxide film;

removing said oxide film, followed by forming gate oxide films of a MOS type transistors on said semiconductor substrate;

forming first conductive films that configure at least parts of a MOS type transistor gate electrodes on said gate oxide films;

removing said first conductive films and said gate oxide films that exist in a predetermined regions for forming element isolation regions, followed by forming trenches on said semiconductor substrate of said predetermined regions;

burying oxide layers in said trenches;

forming a resist pattern that covers the first conductivity type transistor region having at least the second threshold value; and implanting second impurities into said semiconductor substrate through said first conductive films and said gate oxide films to form a concentration peak of the second impurities in set regions in the semiconductor substrate, wherein a depth from an upper surface of the first conductive films to the set regions is substantially equal in an element forming region defined by the element isolation regions, for forming the first conductivity type transistor having the first threshold value using said resist pattern as a mask.

7. A semiconductor device manufacturing method in which a plurality of identical conductivity type transistors has gate oxide films with different film thickness on a semiconductor substrate, said manufacturing method comprising:

forming a first gate oxide film on said semiconductor substrate;

forming a second gate oxide film having a film thickness different from that of the first gate oxide film;

forming a first conductive film on said first gate oxide film and second gate oxide film;

removing said first conductive film and said first gate oxide film that exist in a predetermined region for forming element isolation regions and the second gate oxide film, followed by forming trenches on said semiconductor substrate of said predetermined region;

burying oxide layers in said trenches; and implanting impurities into said semiconductor substrate through said first conductive film, said first gate oxide film, and said second gate oxide film at the same time to form a concentration peak of the impurities in set regions in the semiconductor substrate, wherein a depth from an upper surface of the first conductive films to the set regions in substantially equal in an element forming region defined by the element isolation regions.

8. A semiconductor device manufacturing method according to any one of claims 1 to 7, wherein said first conductive film is a polycrystalline silicon film.

9. A semiconductor device manufacturing method according to claim 8, wherein said first conductive film is a polycrystalline silicon film of 300 nm or less in thickness.

10. A semiconductor device manufacturing method according to claim 9, wherein a second conductive film is laminated on said first conductive film.

11. A nonvolatile memory device manufacturing method having a multi-layered gate electrode type transistor provided on a semiconductor substrate, said manufacturing method comprising:

forming gate oxide films of a MOS type transistors on a semiconductor substrate;

forming a first conductive films that configure at least a first layers of multi-layered gate electrodes of the MOS type transistors on said gate oxide films;

removing portions of said first conductive films and said gate oxide films that correspond to predetermined regions for forming element isolation regions, followed by forming trenches in said semiconductor substrate corresponding to said predetermined regions for forming the element isolation regions;

burying oxide layers in said trenches;

implanting impurities into said semiconductor substrate through said first conductive films and said gate oxide films to form a concentration peak of the impurities in set regions in the semiconductor substrate; and forming a second conductive films that configure second layers on said first conductive films via insulation layers to form multi-layered gate electrodes, wherein a depth from an upper surface of the second conductive films to the set regions is substantially equal in an element forming region defined by the element isolation regions.

12. A semiconductor device manufacturing method according to claim 11, wherein each of said first conductive films has at least a two-layered polysilicon laminate structure.

13. A nonvolatile memory device manufacturing method having multi-layered gate electrode type transistors provided on a semiconductor substrate, said manufacturing method comprising:

forming gate oxide films of a MOS type transistors on the semiconductor substrate;

forming first conductive films that configure at least first layers of multi-layered gate electrodes of the MOS type transistors on said gate oxide films;

forming etching stopper films having etching selectivity with respect to the semiconductor substrate on said first conductive films;

forming a resist pattern in a region other than portions that correspond to element isolation forming regions on said etching stopper films;

removing said etching stopper films and said first conductive films using said resist pattern as a mask;

releasing said resist pattern provided on said etching stopper films, followed by implanting impurities into said semiconductor substrate to form a concentration peak of the impurities in set regions in the semiconductor substrate; and forming second conductive films on said first conductive films via insulation layers to form multi-layered gate electrodes, wherein a depth from an upper surface of the second conductive films to the set regions is substantially equal in an element forming region defined by the element isolation forming regions.

14. A nonvolatile memory device manufacturing method having multi-layered gate electrode type transistors provided on a semiconductor substrate, said manufacturing method comprising:

forming gate oxide films of a MOS type transistors on said semiconductor substrate;

forming first conductive films that configure at least first layers of multi-layered gate electrodes of the MOS type transistors on said gate oxide films;

forming etching stopper films having etching selectivity with respect to said semiconductor substrate on said first conductive films;

forming a resist pattern in a region other than portions that correspond to element isolation forming regions on said etching stopper films;

removing said etching stopper films and said first conductive films using said resist pattern as a mask;

releasing parts of said resist pattern provided on said etching stopper films, followed by implanting impurities into said semiconductor substrate via said first conductive films and said gate oxide films to form a concentration peak of the impurities in set regions in the semiconductor substrate; and forming second conductive films on said first conductive films via insulation layers to form a multi-layered gate electrodes, wherein a depth from an upper surface of the second conductive films to the set regions is substantially equal in an element forming region defined by the element isolation forming regions.

15. A nonvolatile memory device manufacturing method having a multi-layered gate electrode type transistors provided on a semiconductor substrate, said manufacturing method comprising:

forming gate oxide films of a MOS type transistors on said semiconductor substrate;

forming first conductive films that configure at least first layers of multi-layered gate electrodes of the MOS type transistors on said gate oxide films;

forming etching stopper films having etching selectivity with respect to said semiconductor substrate on said first conductive films;

forming a resist pattern in a region other than portions that correspond to element isolation forming regions on said etching stopper films;

removing said etching stopper films and said first conductive films using said resist pattern as a mask;

releasing said resist pattern provided on said etching stopper films, followed by implanting first impurities into said semiconductor substrate;

forming trenches in said semiconductor substrate corresponding to said element isolation forming regions;

removing said etching stopper films provided on said first conductive films at the same time when oxide layers are buried in said trenches;

implanting second impurities into said semiconductor substrate through said first conductive films and said gate oxide films film to form a concentration peak of the impurities in set regions in the semiconductor substrate; and forming a second conductive films on said first conductive films via an insulation layers to form multi-layered gate electrodes, wherein a depth from an upper surface of the second conductive films to the set regions is substantially equal in an element forming region defined by the element isolation forming regions.

16. A semiconductor device manufacturing method in which a first transistor of a first conductivity type having a first threshold value and a second transistor of a first conductivity type having a second threshold value are formed in a peripheral circuit together with a nonvolatile memory device in which a multi-layered gate electrode type transistor is formed as a memory cell on a semiconductor substrate, said manufacturing method comprising:

forming an oxide film on a semiconductor substrate;

introducing impurities into a first region for forming a first transistor of a first conductivity type having a first threshold value and a second region for forming a second transistor of a first conductivity type having a second threshold value via said oxide film;

removing said oxide film, followed by forming gate oxide films that configure MOS type transistors on said semiconductor substrate;

forming first conductive films that configure at least first layers of MOS type transistor gate electrodes on said gate oxide films;

removing portions of said first conductive films and said gate oxide films that correspond to element isolation regions, followed by forming trenches in said semiconductor substrate for forming the element isolation regions;

burying oxide layers in said trenches;

forming a resist pattern that covers at least the second region of the first conductivity type transistor having the second threshold value;

implanting second impurities into said semiconductor substrate through said first conductive films and said gate oxide films to form a concentration peak of the impurities in set regions in the semiconductor substrate in the first region of the first conductivity type transistor having the first threshold value using said resist pattern as a mask; and forming a second conductive films on said first conductive films via insulation layers to form a multi-layered gate electrodes, wherein a depth from upper surfaces of the second conductive films to the set regions is substantially equal in an element forming region defined by the element isolation regions.

17. A method for manufacturing a semiconductor device having a peripheral circuit composed of a plurality of transistors of the same conductivity type and a nonvolatile memory device with a multi-layered gate electrode type transistors as memory cells on a semiconductor substrate, wherein the plurality of transistors that configure the peripheral circuit have gate oxide films with different film thickness, the semiconductor device manufacturing method comprising:

forming a first gate oxide film on the semiconductor substrate;

forming a second gate oxide film with its film thickness different from that of said first gate oxide film;

forming a first conductive film on said first gate oxide film and said second gate oxide film;

removing portions in the first conductive film, first gate oxide film, and second gate oxide film corresponding to a predetermined regions for forming element isolation regions, followed by forming trenches in said semiconductor substrate at said predetermined regions for forming the element isolation regions;

burying oxide layers in said trenches;

implanting impurities into said semiconductor substrate via said first conductive film, first gate oxide film, and second gate oxide film at the same time to form a concentration peak of the impurities in set regions in the semiconductor substrate; and forming a second conductive film on said first conductive film via an insulation layer to form multi-layered gate electrodes, wherein a depth from an upper surface of the second conductive film to the set regions is substantially equal in an element forming region defined by the element isolation regions.

* * * * *